United States Patent [19]

Akagiri et al.

[11] Patent Number: 5,038,310

[45] Date of Patent: Aug. 6, 1991

[54] AMPLITUDE COMPRESSING AND/OR EXPANDING CIRCUIT EMPLOYING ENHANCED NORMALIZATION

[75] Inventors: Kenzo Akagiri; Tomoko Sato, both of Kanagawa, Japan

[73] Assignee: Sony Corporation, Tokyo, Japan

[21] Appl. No.: 511,058

[22] Filed: Apr. 19, 1990

Related U.S. Application Data

[62] Division of Ser. No. 211,553, Jun. 23, 1988, Pat. No. 4,972,164.

[30] Foreign Application Priority Data

Jun. 27, 1987 [JP] Japan .................................. 62-160525
Jun. 30, 1987 [JP] Japan .................................. 62-163611

[51] Int. Cl.$^5$ ............................................. G06F 15/00
[52] U.S. Cl. ............................. 364/715.04; 364/715.08
[58] Field of Search ................... 364/715.04, 715.08, 364/736, 748, 745

[56] References Cited

U.S. PATENT DOCUMENTS

| | | | |
|---|---|---|---|
| 4,528,640 | 7/1985 | Criswell | 364/748 |
| 4,884,190 | 11/1989 | Ngai et al. | 364/748 X |
| 4,905,178 | 2/1990 | Mor et al. | 364/748 |
| 4,926,370 | 5/1990 | Brown et al. | 364/748 X |

FOREIGN PATENT DOCUMENTS

| | | | |
|---|---|---|---|
| 59-125435 | 7/1984 | Japan | 364/748 |
| 60-17534 | 1/1985 | Japan | 364/748 |

Primary Examiner—Gary V. Harkcom
Assistant Examiner—Tan V. Mat
Attorney, Agent, or Firm—Alvin Sinderbrand; William S. Frommer

[57] ABSTRACT

In a circuit for expanding and/or compressing an amplitude of an input signal; a control signal is generated in response to the input signal and supplied to a multiplier circuit for multiplying the input signal by the control signal, a first subtracter subtracts the input signal from the output of the multiplier circuit, a signal processor processes the first subtracter output signal, and a second subtracter subtracts the output signal of the processor from the output signal of the multiplier circuit. The control signal generating circuit includes an envelope detector for detecting the envelope of the output signal of a proceeding absolute value generating circuit and which includes a pre-bit-shifting circuit for bit-shifting the envelope detected output signal by an amount determined by a pre-bit-shifting control signal, a normalizing circuit bit-shifting the output signal of the pre-bit shifting circuit so such that a normalized output signal is generated, the normalizing circuit further generating a bit shift signal representing a bit shift amount required for normalizing a pre-bit shifted signal corresponding to the detected envelope output signal occurring just prior to the current detected envelope output signal being applied to the pre-bit-shifting circuit, and a control circuit supplied with the bit shift signal for generating the control signal supplied to the pre-bit-shifting circuit.

5 Claims, 20 Drawing Sheets

FIG. I
(PRIOR ART)
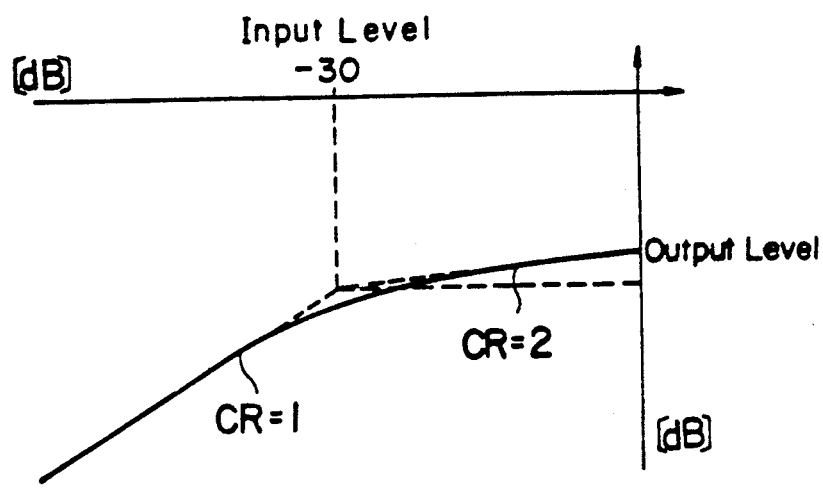
FIG. 2
(PRIOR ART)
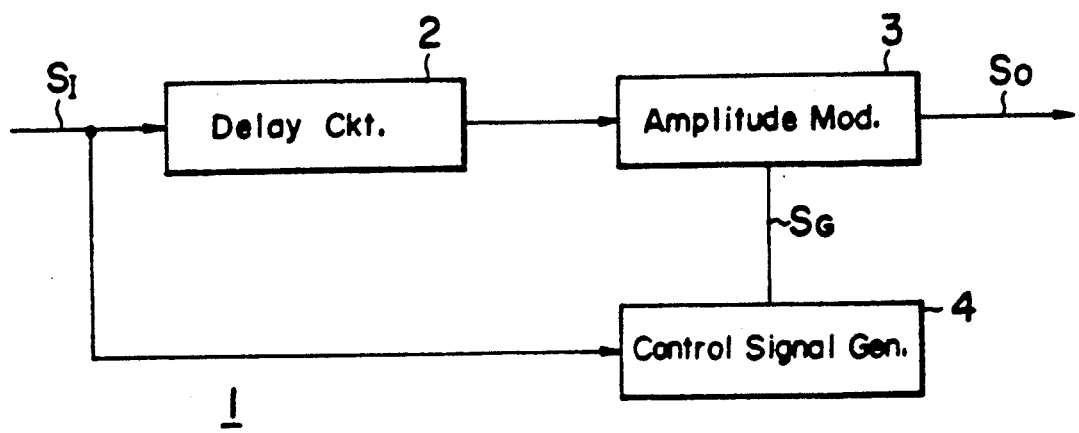

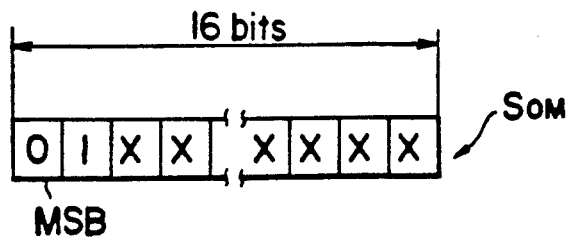
FIG.22(A)
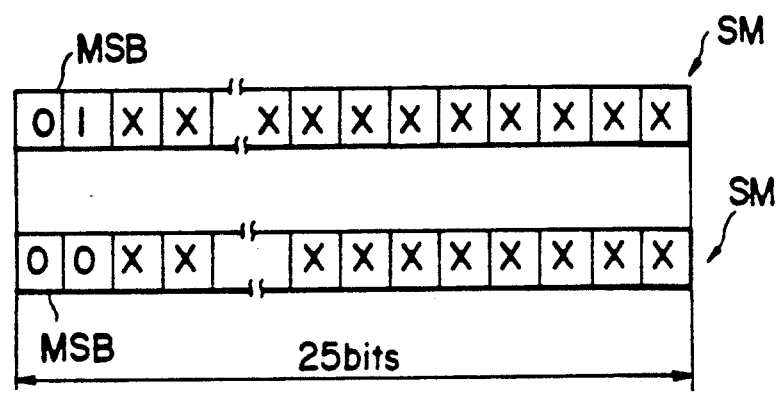
FIG.22(B)
FIG.22(C)
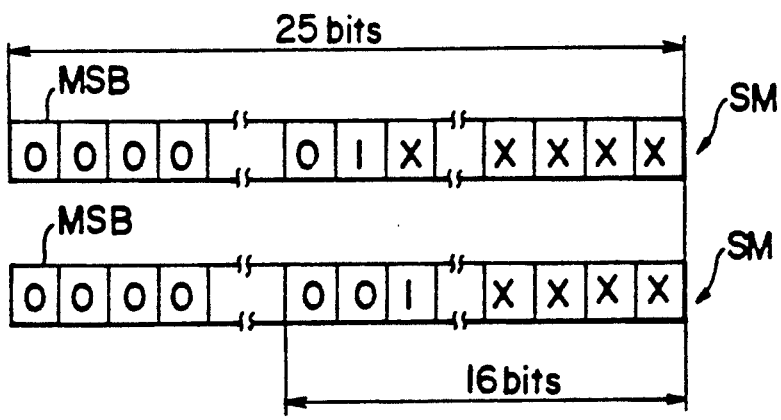
FIG.23(A)
FIG.23(B)

AMPLITUDE COMPRESSING AND/OR EXPANDING CIRCUIT EMPLOYING ENHANCED NORMALIZATION

This application is a division of application Ser. No. 07/211,553, filed June 23, 1988, now U.S. Pat. No. 4,972,164.

BACKGROUND OF THE INVENTION

1. Field of the Invention

The present invention relates to an amplitude compressing/expanding circuit which is suitable for use in signal processing circuits of electronic appliances such as a compact disc (CD) player or a tape recorder.

2. Prior Art

In digital audio signal reproducing apparatus such as CD players and digital audio tape recorders (DAT), an audio signal is digitized and recorded on a recording medium, then reproduced and demodulated into a corresponding analog signal, whereby, a high-quality audio signal with little noise over a wide dynamic range is obtained.

An audio signal obtained from such digital audio signal reproducing apparatus, however, has an undesirably wide dynamic range.

Because of the unnecessarily wide dynamic range, the signal waveform of this audio signal, when recorded by an analog tape recorder, is distorted at its higher signal level portion or has a deteriorated SN (signal-to-noise) ratio at its lower signal level portion.

Further, when a CD player or the like plays back such a signal in an environment where there is background noise, such as within an automobile, there arises another problem in which the signal portion at the lower signal level is lost in the background noise and becomes inaudible, or, conversely, the signal portion at the higher signal level produces an excessively large volume of sound.

To solve such conventional problems, one of the better solutions is to reduce the dynamic range of the audio signal obtained from the digital audio signal reproducing apparatus.

As shown in FIG. 1 for an input signal derived from an audio signal converted into an analog signal, the input signal at levels lower than −30 dB of the peak level is transformed to an output signal having a signal level which varies in proportion to the variation in the input signal level, the constant of proportion being 1.

For the range higher than −30 dB, the input signal also may be transformed to an output signal having a signal level which varies in proportion to the variation in the input signal level, with, however, a constant of proportion, for example, of $\frac{1}{2}$.

By so doing, an input-output characteristic having ratios of amplitude compression (CR) of 1 at levels below the −30 db point and 2 at levels above the −30 db point is obtained (hereinafter such point, −30 db in the example, will be referred to as a threshold point, or level). As a result the dynamic range of the audio signal as a whole can be made narrower.

A prior art method using an amplitude compressing/expanding circuit 1 of the structure shown in FIG. 2 achieves such an amplitude compressing and expanding effect.

An input signal $S_I$ is input to an amplitude modulation circuit 3 through a delay circuit 2 and to a control signal generator circuit 4.

The control signal generator circuit 4 detects the signal level of the input signal and, based upon the result of the detection, outputs to the amplitude modulation circuit 3 a control signal $S_G$ having a signal level which changes in accordance with the signal level of the input signal $S_I$.

The amplitude modulation circuit 3 is constructed of a multiplier circuit, such as a VCA (voltage controlled amplifier) or the like. By having the input signal $S_I$ amplitude-modulated by the control signal $S_G$, an output $S_O$ is obtained having a signal level corresponding to the input signal $S_I$, but changed according to the signal level of the control signal $S_G$.

The delay circuit 2 is provided so that no overshoot may occur in the output signal $S_O$.

Representing the amplitude of the input signal $S_I$ by "x" and the amplitude of the output signal So by "y", y can be expressed as a function of x and the amplitude compression ratio CR:

$$y = x^{1/CR} \quad (1)$$

For an amplitude compression ratio CR of 1 as when below the threshold point, the amplitude y is expressed as:

$$\begin{aligned} y &= x^{1/CR} \\ &= x \cdot x^{(1-CR)/CR} \\ &= x \cdot x^0 \\ &= x \cdot 1 \end{aligned} \quad (2)$$

The amplitude compression ratio CR of value 1 in the region below the threshold point can be obtained by generating control signal $S_G$ so that the gain "g" in the amplitude modulation circuit 3 equals 1, as expressed by $$g = 1. \quad (3)$$

In contrast thereto, to obtain an amplitude compression ratio CR of value 2 as desired for when applied to the amplitude x of the input signal $S_I$ in the range above the threshold point, the amplitude "y" of the output signal $S_O$ and the gain "g" in the amplitude modulation circuit 3 are given by $$\begin{aligned} y &= x^{1/CR} \\ &= x \cdot x^{(1-CR)/CR} \\ &= x \cdot x^{-\frac{1}{2}} \end{aligned} \quad (4)$$

$$\begin{aligned} g &= x^{(1-CR)/CR} \\ &= x^{-\frac{1}{2}} \end{aligned} \quad (5)$$

Therefore, an input/output characteristic providing the amplitude compression ratio CR having value of 2 for the range above the threshold point can be obtained by outputting the control signal $S_G$ so that the gain g in the amplitude modulation circuit 3 may become $x^{-1/2}$.

To provide such a characteristic, the control signal generator circuit 4 may be structured, for example, as shown in FIG. 3. As illustrated the input signal $S_I$ is supplied through an absolute value circuit 5 to an envelope detector circuit 6 to produce a detection signal $S_L$ proportional to the signal level of the input signal $S_I$. This signal is then subjected to logarithmic conversion in an logarithmic converter circuit 7 and output to an adder circuit 9.

The adder circuit 9 sums the logarithmically-converted detection signal $S_L$ and a threshold point signal $S_H$. A clipping circuit 8 receives the output of the adder circuit 9 and clips the summation signal below a 0 value and outputs the clipped signal $S_{CL}$ to a multiplier circuit 10.

Thus, because the input signal $S_I$ is determined by the threshold point signal $S_H$, a clipped signal $S_{CL}$ is obtained which varies with respect to the input signal $S_I$ by setting the threshold point signal $S_H$ to a predetermined value.

The multiplier circuit 10 receives both the clipped signal $S_{CL}$ and a compression ratio controlling signal Sp and outputs a product signal thereof to the amplitude modulation circuit 3 through an exponential converter circuit 11.

By expressing the amplitude of the input signal $S_I$ at the threshold point ($-30$ dB in the present case) as "Y" and the amplitude of the output signal from the logarithmic converter circuit 7 as H when the input signal $S_I$ is at its peak level, the threshold point signal $S_H$ is expressed as $$S_H = H - Y/20 \, log_e 10 \, .... \quad (6)$$

Accordingly, a clipped signal $S_{CL}$ is obtained having a signal level which varies with the signal level of the input signal $S_I$ only when the input signal $S_I$ is larger than the signal level at the threshold point.

As a result, in the range below the threshold point, the clipped signal $S_{CL}$ clipped at the 0 value through the clipper circuit 8 is obtained, and a control signal $S_G$ is output through the exponential converter circuit 11 having a value of 1 corresponding to the 0 value.

Consequently, the gain of the multiplier circuit 3 is limited to 1 and an output signal $S_O$ is obtained having an amplitude compression ratio CR equal to 1 as shown in equation (2). Thus, the input/output characteristic for producing an amplitude compression ratio CR of 1 is obtained.

For the range above the threshold point, the input/output characteristic for producing an amplitude compression ratio of 2 will be satisfied if the gain of the multiplier circuit 3 is arranged to become $h^{-\frac{1}{2}}$, as indicated in equation (5).

To do so a control signal $S_G$, expressed as $$S_G = x^{(1-CR)/CR} \, .... \quad (7)$$

may be output with respect to the input signal $S_I$.

More particularly, if the compression ratio controlling signal Sp is supplied to the multiplier circuit 10 so that the gain therein is expressed as $$Ap = -(CR-1)/CR = -\tfrac{1}{2} \, .... \quad (8)$$

an output signal $S_O$ can be obtained whose amplitude is compressed by the compression ratio CR (CR=2 in the present case) in the range above the threshold point.

Thus, an amplitude compressing/expanding circuit 1 can generate an input/output characteristic which changes the amplitude compression ratio CR from 1 to 2 when the signal level of the input signal $S_I$ is increased across the signal level at $-30$ db.

However, in the above-described conventional circuit arrangement, the amplitude compression ratio CR abruptly changes between the front range and the rear range of the threshold point, and therefore, when the audio signal is reproduced in the conventional amplitude compressing/expanding circuit I, the reproduced sound is extremely unnatural to listeners.

To solve such problem, one conventional method has been proposed in which the amplitude compression ratio CR is gently changed by gradually changing the signal levels of the threshold point signal $S_H$ and the compression ratio controlling signal Sp in accordance with a change in the signal level of the input signal by using, for example, a ROM (read only memory) table.

Another conventional method has been proposed in which the threshold point signal $S_H$ and the compression ratio controlling signal Sp are controlled by a control circuit having a processing circuit arrangement instead of ROM table.

However, if such conventional methods are used, the construction of the amplitude compressing/expanding circuit as a whole becomes complex. Therefore, such methods are not yet satisfactorily practicable in the recent technology.

Further, because the output signal $S_O$ of the above-described amplitude compressing/expanding circuit is only obtained as a multiplied output signal $S_O$ depending upon the control signal $S_G$ provided from the control signal generator circuit 4, the operating characteristic cannot be variable in accordance with the frequencies of the input signal.

The capability of making the operating characteristic of an amplitude compressing/expanding function variable with the frequencies of the input signal is widely applicable to the arts for handling audio signals. For example, the input signal is applied to the compressed amplitude audio signal to compensate for the lack of the dynamic range that can be heard.

SUMMARY OF THE INVENTION

Accordingly, it is an object of the present invention to provide an improved amplitude expander and/or compressor circuit which is free from the above-mentioned drawbacks encountered in the prior art circuit.

It is another object of this invention to provide an improved amplitude expander and/or compressor circuit in which a desired input/output characteristic can be obtained with a relatively simple circuit construction.

It is another object of the present invention to provide an improved amplitude expander and/or compressor circuit having an input/output characteristic which can be controlled in accordance with the frequencies of an input signal.

It is another object of this invention to provide an improved amplitude expander and/or compressor circuit in which an input signal can be normalized at high speed with a simple circuit construction.

It is another object of this invention to provide an improved amplitude expander and/or compressor circuit in which a smooth change in the amplitude compression ratio near the threshold level of the input signal can be obtained with a simple circuit construction.

It is another object of this invention to provide an improved amplitude expander and/or compressor circuit in which the amplitude compression ratio is changed smoothly even with a plurality of amplitude compression changing points.

These and other objects of the invention are accomplished by an amplitude compressing/expanding circuit in which the amplitude compression ratio for the output signal is switchable by controlling the change in the gain of an amplitude modulating circuit based upon the signal level of the input signal or the signal level of an output signal from the amplitude modulating circuit. The amplitude compressing/expanding circuit includes an adder circuit for outputting a difference signal between the input signal and output signal and a signal processing circuit for generating an output signal whose signal level varies with the difference signal. The amplitude compressing/expanding circuit is adapted to output a summation signal of the output signals from the amplitude modulating circuit and the signal processing circuit.

In accordance with the amplitude compressing/expanding circuit the difference signal between the input signal and the output signal of the amplitude modulating circuit is input to processing circuit and processed to generate a signal to be added to the output to generate a summation signal. By selecting a suitable input/output characteristic of the processing circuit, the summation signal may achieve a more preferable input/output characteristic than that of the output signal.

BRIEF DESCRIPTION OF THE DRAWINGS

For a better understanding of these and other objects of the present invention, reference is made to the following detailed description of the invention read in conjunction with the following drawings, in which:

FIG. 1 is a characteristic curve diagram used for explaining problems in the prior art amplitude compressing/expanding circuit;

FIGS. 2 and 3 are schematic block diagrams of a conventional amplitude compressing/expanding circuit;

FIGS. 22 and 23 show data examples used for explaining the operation of the control signal generator shown in FIG. 16;

DETAILED DESCRIPTION OF THE PREFERRED EMBODIMENT

One preferred embodiment according to the invention will now be described with reference to the accompanying drawings.

Figure 4:
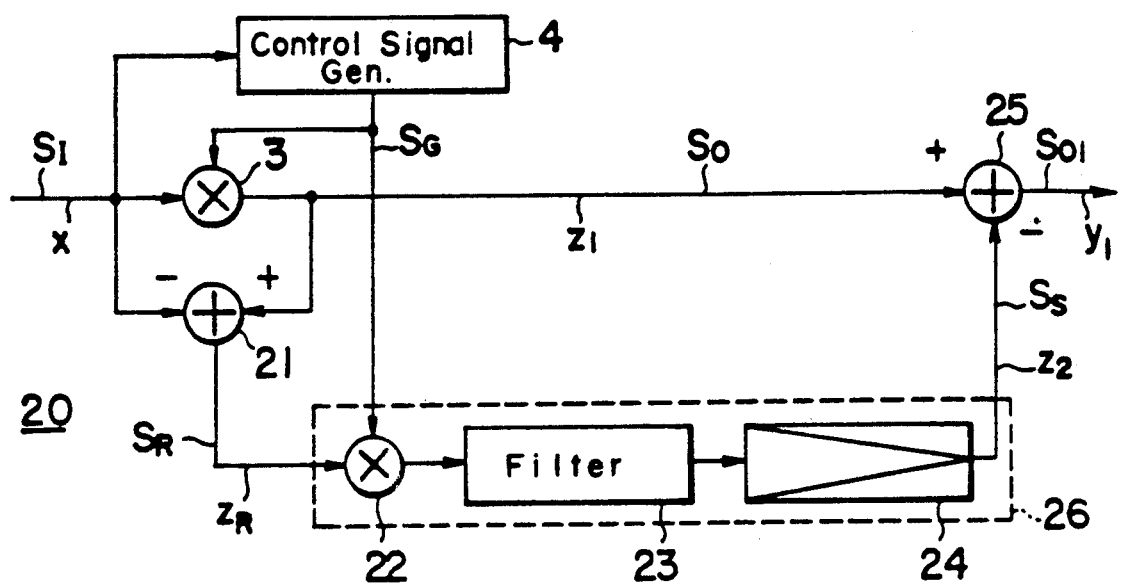
FIG. 4 is a schematic block diagram of an amplitude compressing/expanding circuit according to the present invention.

It should be noted that the same reference numerals shown in FIG. 2 will be employed as those for denoting the same or similar circuit elements shown in FIG. 4.

FIG. 4 shows an amplitude compressing/expanding circuit 20 having an input signal $S_I$ and an amplitude compressed and/or expanded output signal $S_{01}$. The input signal $S_I$ is input to a control signal generator 4, a multiplier circuit 3, and a subtracter circuit 21. The control signal generator 4 produces a control signal $S_G$ as a function of the input signal $S_I$, and outputs the control signal to the multiplier circuit 3 and signal processing circuit 26. The input signal $S_I$ and the control signal $S_G$ are multiplied at the multiplier circuit 3 to generate a multiplied output signal $S_O$. The input signal $S_I$ is subtracted from the multiplied output signal $S_O$ at subtracter circuit 21 to generate a difference signal $S_R$. The difference signal $S_R$ is input to a multiplier circuit 22 of the signal processing circuit 26.

The multiplier circuit 22 multiplies the control signal $S_G$ and the difference signal $S_R$ to produce a product (multiplied) output signal which then is filtered by a filter circuit 23, and amplified by an amplifier circuit 24 and output from the signal processing circuit 26 as a processed signal.

When the multiplier circuit 22 is operated with its gain set below 1, so as to perform an amplitude compressing operation, the processed signal is an output signal $S_S$ having a phase in inverse relationship with the phase of the output signal $S_O$. The output signals $S_O$ and $S_S$ are subtracted at an adder circuit 25 to generate a summation signal $S_{01}$.

The amplitude compressing/expanding circuit 20 according to one preferred embodiment thus includes a multiplier circuit 3 for amplifying the input signal $S_I$ by a gain defined by the control signal $S_G$ and a sub-pass circuit including a subtracter circuit 21 and a signal processing circuit 26. The subtracter circuit 21 generates a difference signal $S_R$ which is processed by the signal processing circuit 26. The signal processing circuit 26 includes a multiplier circuit 22, a filter circuit 23, and an amplifier circuit 24.

In the case where the signal level of the input signal $S_I$ is below a threshold level, the gain "g" of the multiplier circuit 3 is set to a value of 1. As a result, the signal level of the difference signal $S_R$ is 0, and thus the output signal $S_O$ generated by the main pass circuit is the signal output through the adder circuit 25.

On the other hand, if the signal level of the input signal $S_I$ rises above the threshold level, the gain "g" of the multiplier circuit 3 is switched to ½. As a result the rise in the input signal level is accompanied by (1) an increase in the signal level of the difference signal $S_R$ and (2) an increase in the signal level of the output signal $S_S$ generated by the subpass circuit; causing (3) the proportion of the output signal $S_S$ to the output signal $S_{O1}$ to be increased.

Thus, by setting the input/output characteristic of the signal processing circuit 26 to a suitable value, it is possible to obtain a gradual variation in the signal level of the output signal $S_{O1}$ (i.e. a gentle curve increase) while the signal level of the input signal $S_I$ is being increased.

Setting both the gain of the multiplier circuit 3 and the multiplier circuit 22 to "g", representing the transfer function of the filter circuit 23 by $F(\omega)$ and representing the gain of the amplifier circuit 24 by "A", an output signal $S_O$ having an amplitude $Z_1$ is given by the following equation:

$$Z_1 = gx \quad ... \quad (9)$$

As a consequence, a difference signal $S_R$ having an amplitude $Z_R$ is given by the following equation:

$$\begin{aligned} Z_R &= Z_1 - x \\ &= gx - x \end{aligned} \quad (10)$$

In addition, an output signal $S_S$ having an amplitude $Z_2$ is given by the following equation:

$$\begin{aligned} Z_2 &= g \cdot A \cdot F(\omega) \cdot Z_R \\ &= g \cdot A \cdot F(\omega) \cdot (gx - x) \end{aligned} \quad (11)$$

Based on equations (9) and (11), an output signal $S_{O1}$ having an amplitude $y_1$ can be obtained as defined by the following equation:

$$\begin{aligned} y_1 &= Z_1 - Z_2 \\ &= gx - g \cdot A \cdot F(\omega) \cdot (gx - x) \\ &= \{(1 + F(\omega) \cdot A) - F(\omega) \cdot A \cdot g\}gx \end{aligned} \quad (12)$$

When the gains "g" of the multiplier circuits 3 and 22 are changed between values 0 and 1, and amplitude "x" equals one ($x = 1$) and transfer function $F(\omega)$ equals one ($F(\omega) = 1$) it is possible to predict the output characteristics of the amplitude compressing/expanding circuit 20 while the signal level of the input signal $S_I$ is kept constant and the amplitude compression control signal $S_G$ is varied.

Substituting the following equations $$F(\omega) = 1 \quad .... \quad (13)$$

$$x = 1 \quad .... \quad (14)$$

in equation (12), gives the following equation for amplitude $y_1$:

$$y_1 = \{(1 + A) - A \cdot g\}g \quad .... \quad (15)$$

Figure 5:
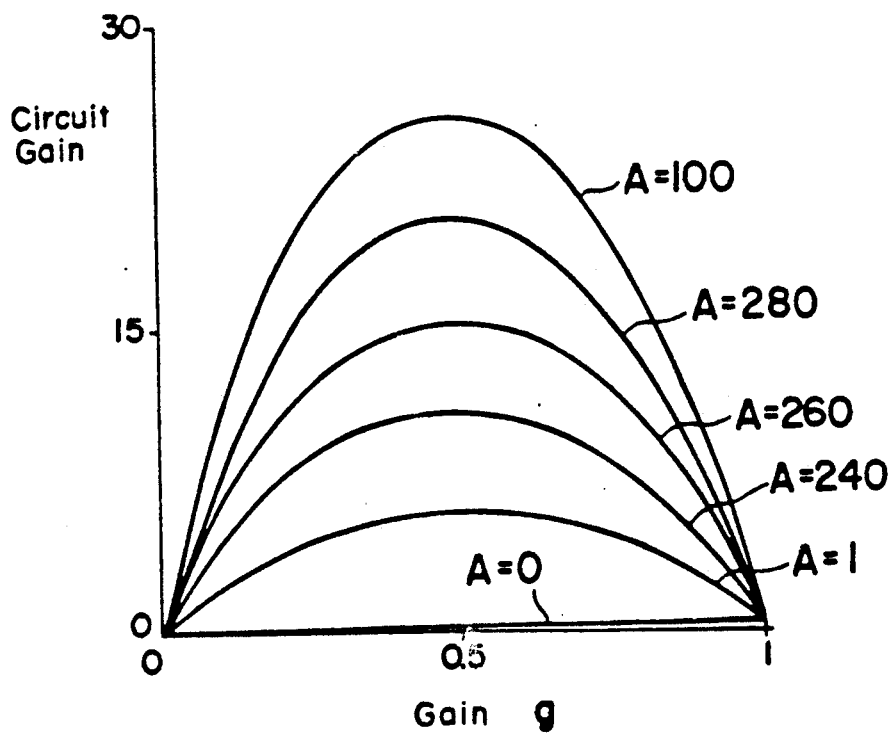
FIGS. 5 through 12 are characteristic curve diagrams used for explaining various operations of the amplitude compressing/expanding circuit shown in FIG. 4.

FIG. 5 shows the output characteristics for the relationship where the gain "g" is varied between 0 and 1. The gain of the amplitude compressing/expanding circuit 20 as a whole is maximum for a given configuration when the gain "g" equals 0.5. The gain of the circuit as a whole increases as the gain "A" of the amplifier circuit 24 is increased.

Further, when the gain A is kept at 0 and the gain g is changed from 0 to 1, the output characteristic obtained in which the gain linearly increases therewith, is based only on the main pass circuit. When the gain A is of values other than "0", the gains of the sub-pass circuit are superposed on the gain of the main pass circuit, and thereby, all the output characteristics obtained have characteristic curves with ascending inclinations toward the right as shown in FIG. 5.

Thus, by controlling the gain of the sub-pass circuit, the gain of the amplitude compressing/expanding circuit 20 as a whole can be controlled. Therefore, an output signal $S_{O1}$ can be obtained which varies with a desired input/output characteristic. The characteristic based on the parameters of the sub-pass circuit for the main pass circuit.

Referring to FIG. 4, if the transfer function $F(\omega)$ of the filter circuit 23 is set to a value of 1, an operating characteristic is obtained having a smooth change of the amplitude compression ratio CR. Further, by setting the gain A of the amplifier circuit 24 to a specific value, it becomes possible to perform both the amplitude compressing operation and amplitude expanding operation at the same time.

The operation of the circuit of FIG. 4 is described below for the case where the threshold point is set to 0 dB and the amplitude compression ratio CR is 2.

In this case, the gain of the multiplier circuit 3 in the range above the threshold point is set to the value of $x^{-\frac{1}{2}}$ according to equation (5). Hence, the gain of the multiplier circuit 22 also will be set to the value of $x^{-\frac{1}{2}}$ in the range above the threshold point.

Figure 6:
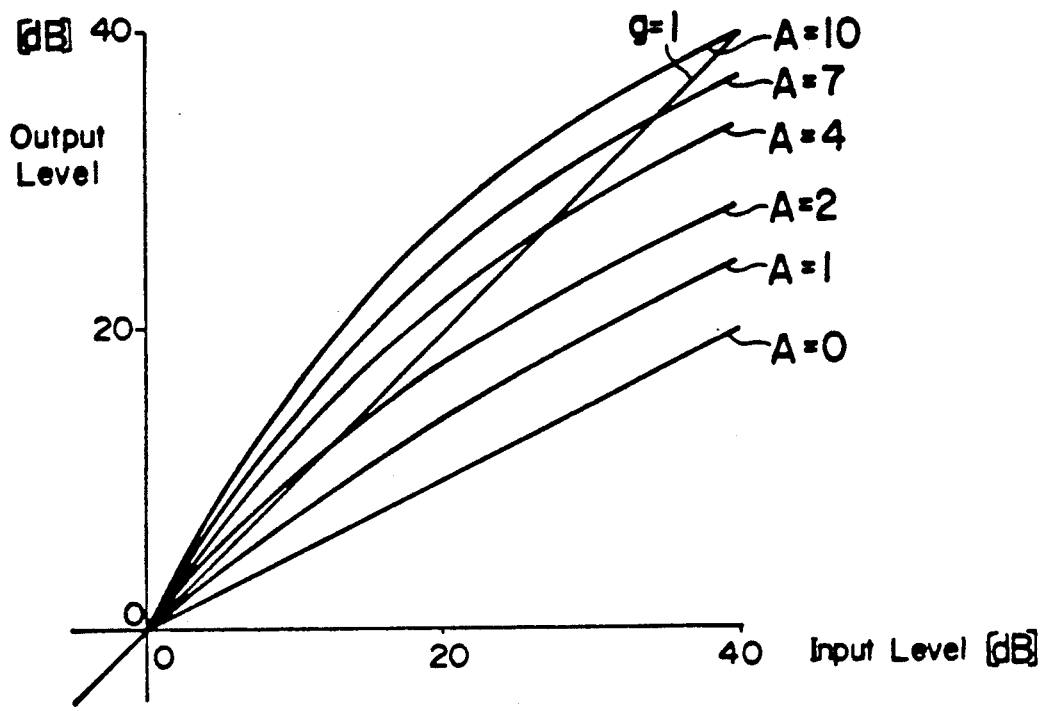
Figure 7:
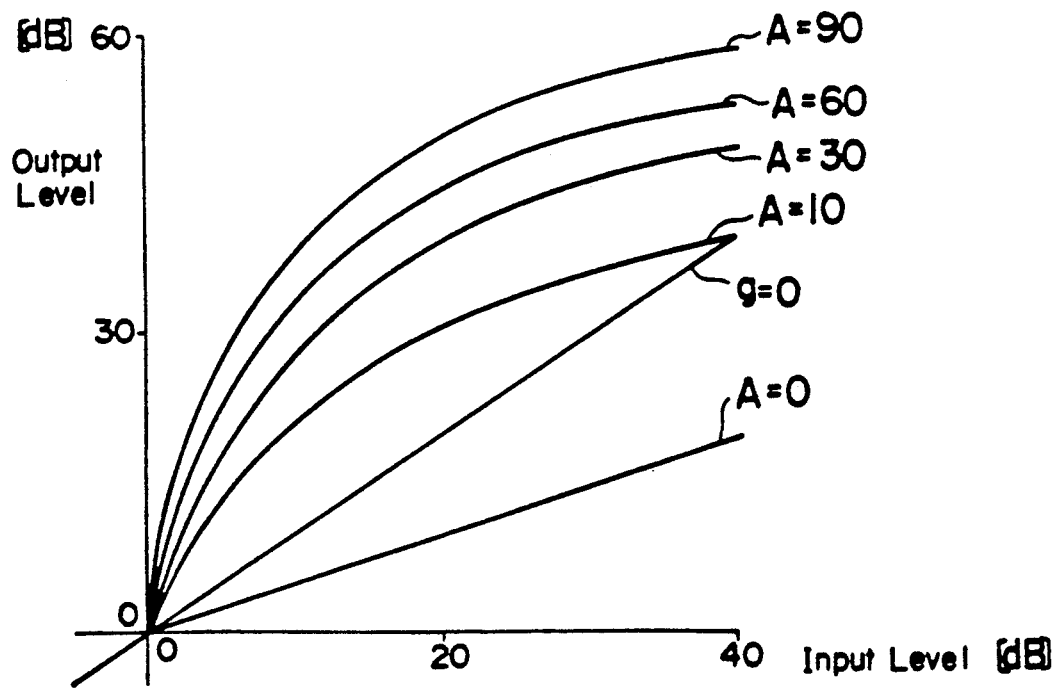

In the range below the threshold point, the amplitude $x_R$ of the difference signal $S_R$ equals 0. Therefore, an output signal $S_{O1}$ proportional to the input signal $S_I$ as shown in FIGS. 6 and 7 is obtained.

In the range above the threshold point, by substituting $$F(\omega) = 1 \quad .... \quad (16)$$

$$g = x^{-\frac{1}{2}} \quad .... \quad (17)$$

in equation (12), the amplitude $y_1$ is expressed as $$\begin{aligned} y_1 &= \{(1 + A) - A \cdot x^{-\frac{1}{2}}\} x^{-\frac{1}{2}} \cdot x \\ &= (1 + A) \cdot x^{-\frac{1}{2}} - A \end{aligned} \quad (18)$$

In this case, if the gain A is approximately 1, and the signal level of the input signal $S_I$ is increased over the threshold point, then the variation in the signal level of the output signal $S_{O1}$ gradually decreases so as to have a characteristic curve which becomes parallel to the characteristic for an amplitude compression ratio CR of 2 (namely, parallel to the input/output characteristic represented by a straight line when the gain A is the value of 0).

Thus, it is possible according to the preferred embodiment to obtain an input/output characteristic providing such amplitude compressing action that the amplitude compression ratio CR will slowly change from the value of 1 to the value of 2 after the signal level has crossed over the threshold point.

In the case where the gain A becomes higher than 3, an input/output characteristic is obtained in which the change in the signal level of the output signal $S_{O1}$ in relation to the signal level of the input signal $S_I$ abruptly increases when the signal exceeds the threshold level. After the amplitude compression ratio CR has changed, however, from 1 to a value smaller than 1 (namely, after an amplitude expanding operation is performed), an input/output characteristic results which either, gradually becomes parallel to the input/output characteristic represented by the straight line of the case where the gain A is 0, or causes the amplitude compression ratio CR to approach 2.

It is apparent that the greater a change in the amplitude compression ratio, the larger the gain A to be utilized.

As a consequence, a desirable input/output characteristic can be obtained according to the preferred embodiment which provides an amplitude expansion effect after the threshold point has been crossed and then slowly turns to provide amplitude compression effect.

The case where the amplitude compression ratio CR is further increased to 100 is examined below. In this case, CR=100 is substituted in equation (5), resulting in the following equation for "g":

$$g = x^{-99/100} \quad \ldots \quad (19)$$

Substituting $X^{-99/100}$ for $x^{-\frac{1}{2}}$ in equation (18), results in the following equation for amplitude y.

$$\begin{aligned} y_1 &= \{(1 + A) - A \cdot x^{-199/100}\} x^{-99/100} \cdot x \quad (20) \\ &= (1 + A) x^{1/100} - A \cdot x^{-98/100} \end{aligned}$$

Figure 8:
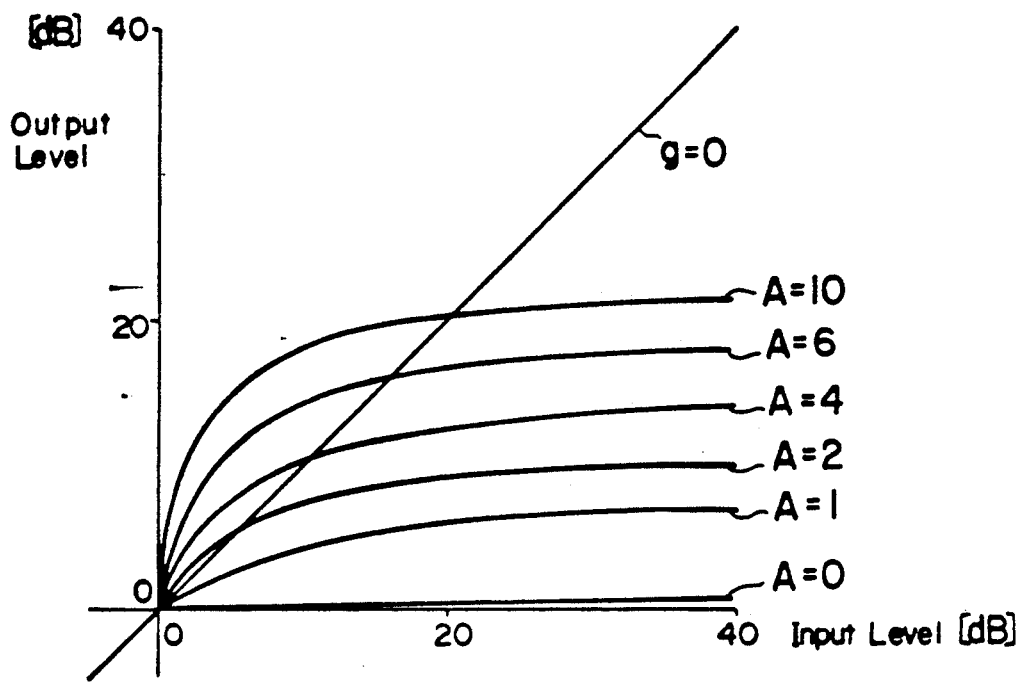
Figure 9:
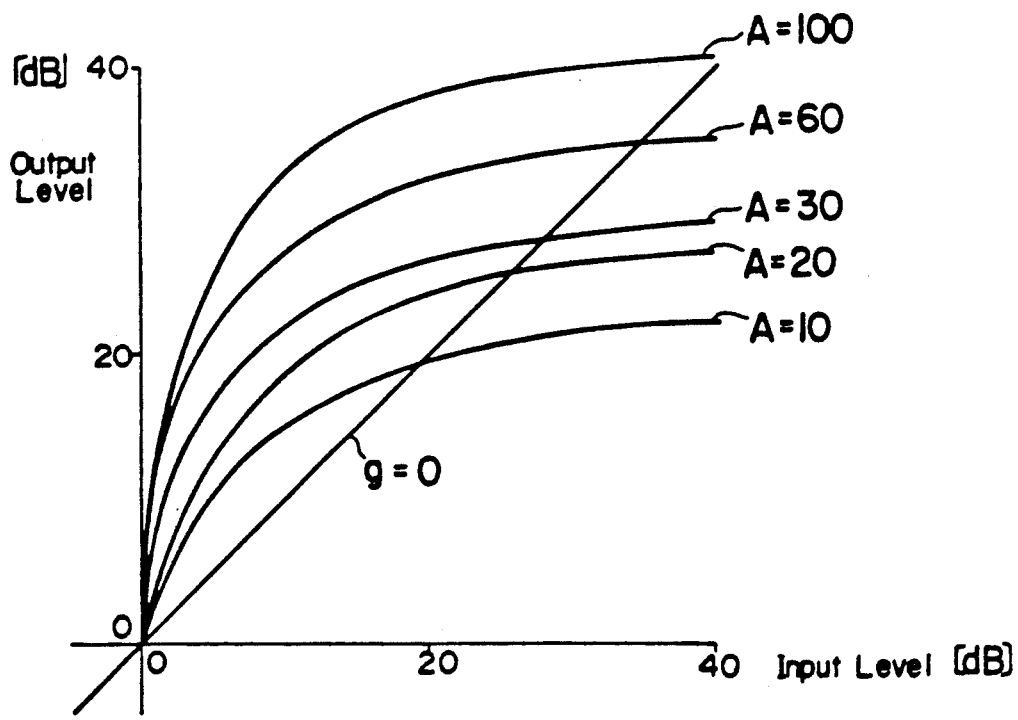

The input/output characteristics obtained are shown in FIGS. 8 and 9 for a gain A equal to 0 and an amplitude compression ratio CR which varies linearly in the range beyond the threshold point. When the gain A is approximately 1, the amplitude compression ratio CR varies gently from 1 to 100.

If the gain A is larger than 2, input/output characteristics are obtained which provide an amplitude expansion effect corresponding to respective values of the gain A, then slowly turn to provide the amplitude compression effect.

Figure 10:
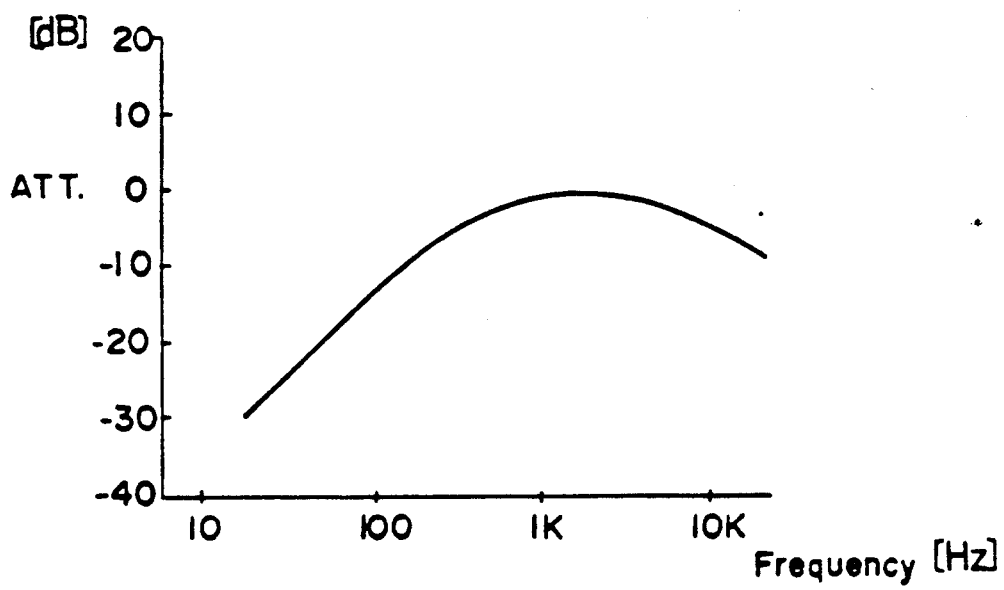

A description is given below of an amplitude compressing/expanding operation in which a band-pass filter having a frequency characteristic as shown in FIG. 10 is used as the filter circuit 23 in the circuit arrangement of FIG. 4.

Thus, the filter circuit 23 is constructed of a band pass filter circuit whose center frequency is 2-3 KHz and is attenuating at 6 dB/OCT.

If the gain A of the amplifier circuit 24 is set to 1 and the amplitude compression ratio CR is set to 2, the following relationship is obtained from equation (12)

$$\begin{aligned} y_1 &= \{(1 + F(\omega)) - F(\omega) \cdot x^{-\frac{1}{2}}\} \cdot x^{-\frac{1}{2}} \cdot x \quad (21) \\ &= (1 + F(\omega)) \cdot x^{\frac{1}{2}} - F(\omega) \end{aligned}$$

Since the first term on the right side of equation (21) includes the transfer function $F(\omega)$, it is known that the amplitude compressing/expanding operation will change according to the frequency characteristic of the filter circuit 23.

Figure 11:
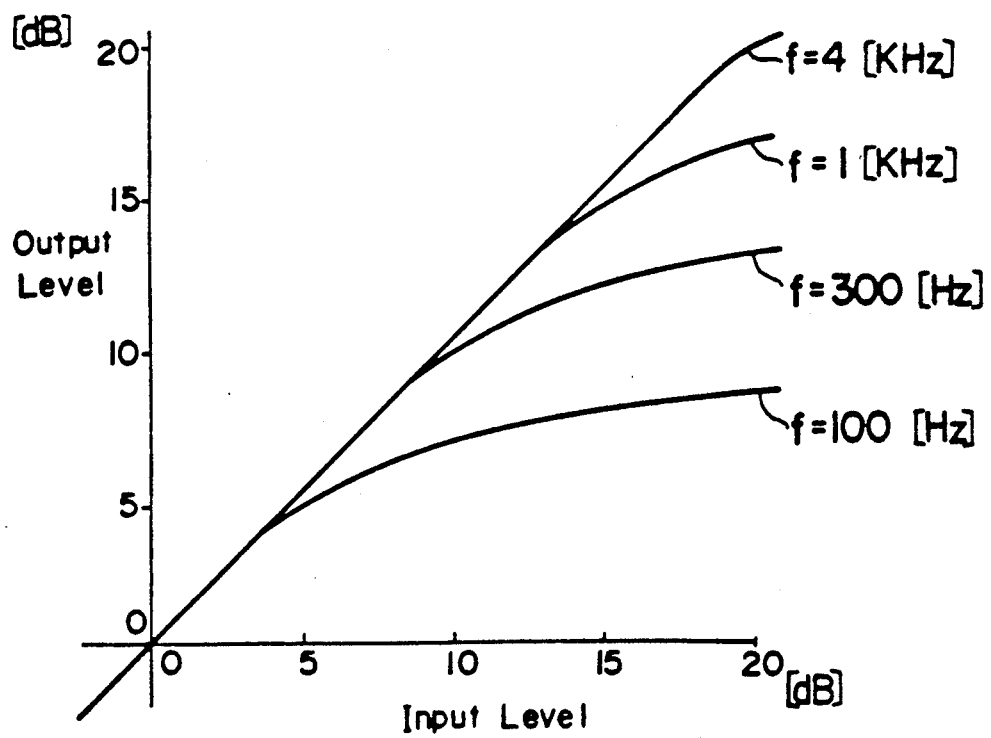

It is known from FIG. 11 that the amplitude compression ratio CR changes toward a value of 2 as the signal level of the input signal $S_I$ is increased over the threshold point at 0 dB. Further, it is known that the closer to the center frequency of the band-pass filter the frequency is, the slower the above-described change occurs.

Figure 12:
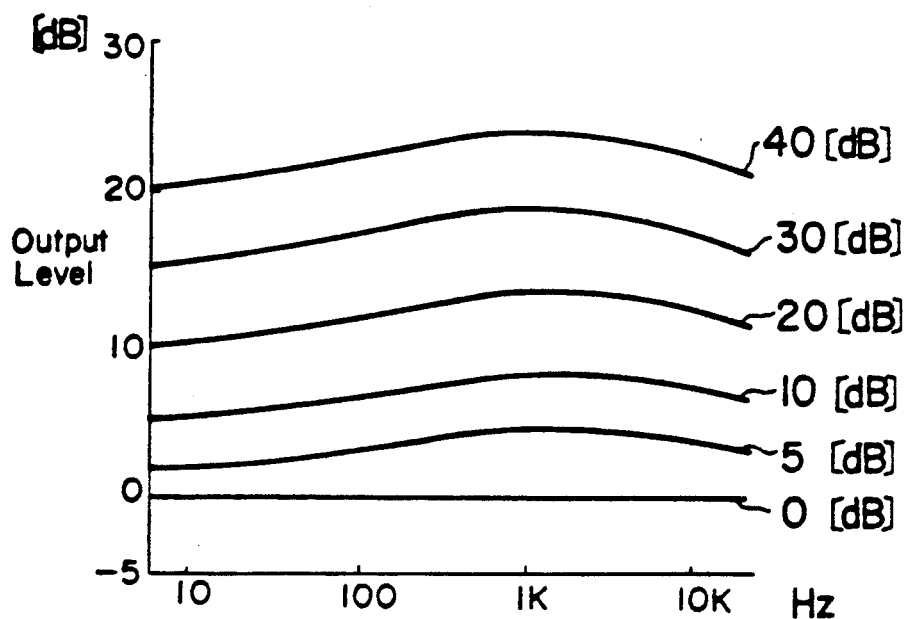

Further, if the input signal $S_I$ is expressed with the frequency taken along the abscissa as shown in FIG. 12, the amplitude compressing/expanding operation varies in the range up to approximately 15 dB of the input signal $S_I$. The amplitude compression ratio CR, however, becomes constant at 2 for the range where the input signal $S_I$ exceeds approximately 20 dB.

Thus, according the preferred embodiment an amplitude compressing/expanding circuit may be obtained having an input/output characteristic with amplitude compressing/expanding action which varies with the frequency of the input signal $S_I$.

Referring again to FIG. 4, the circuit is configured with the gain A of the amplifier circuit 24 set to approximately 1 and the center frequency of the band-pass filter 23 at approximately 4 kHz (to obtain the highest sensitivity for a listener).

When the circuit of FIG. 4 is so configured and the parameters are set as described with reference to FIGS. 11 and 12 above, an input/output characteristic is obtained providing a slowly changing amplitude compression ratio as the signal level of the input signal is increased over the threshold point.

Therefore, an audio signal may be obtained with a compressed dynamic range without the unnaturalness in the reproduced sound caused in the past by the abrupt change in the amplitude compression ratio.

Further, an input/output characteristic may be obtained providing differing amplitude compressing operations in accordance with the frequencies of the input signal $S_I$. As a result, it is possible to cause the amplitude compression to gradually increase its effect as the input signal $S_I$ is increased in level. In addition, the frequency of the input signal $S_I$ approaches the center frequency, 4 kHz, of the band-pass filter.

Therefore, the reduction in the dynamic range near the center frequency 4 kHz can be made correspondingly smaller than the reduction in the dynamic range at other frequencies.

Figure 13:
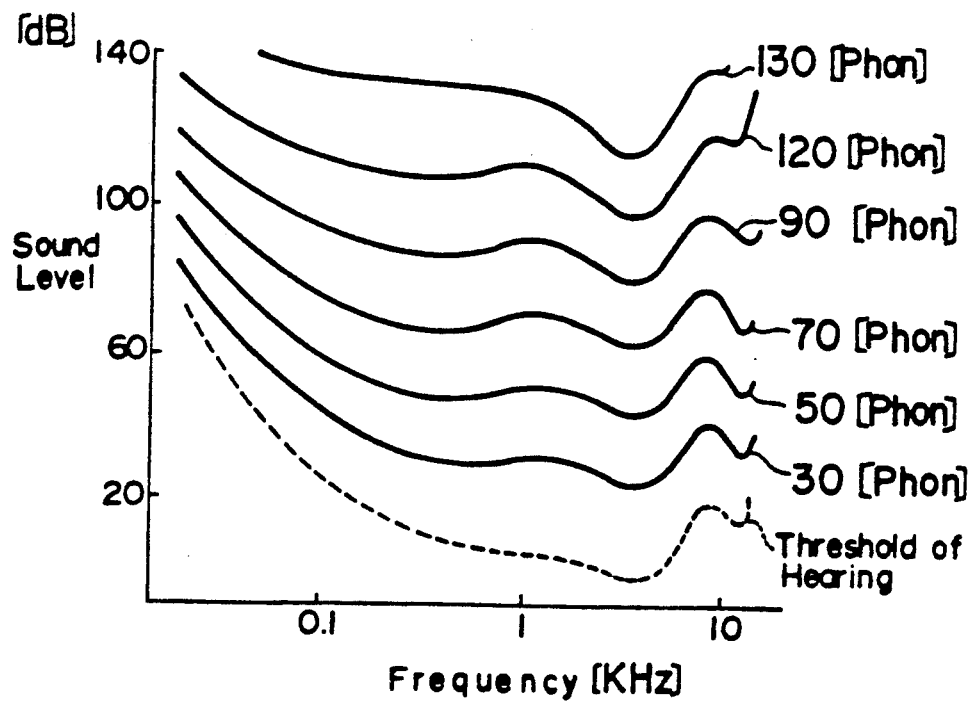
FIG. 13 is a characteristic curve diagram showing a loudness curve.

As shown in FIG. 13, human hearing ability is most sensitive to the 4 kHz frequency. Therefore, for the situation where the dynamic ranges are reduced, if the dynamic range at around the 4 kHz frequency is not reduced as much as the other frequencies, the lack of dynamic range on the whole in the reproduced sound is not sensed to be as much of a reduction than if the 4 kHz frequency range also were reduced.

Therefore, not only is the dynamic range of an audio signal obtained from a digital audio signal reproducing apparatus reduced without inducing unnaturalness, but also the resultant feeling of reduction in the dynamic range sensed by hearing can be reduced.

Even when an audio signal obtained from a digital audio signal reproducing apparatus is heard with background noise present, and the volume of sound is not allowed to be made greater, or the like, the reproduced signal can be heard satisfactorily. Moreover, when the signal is recorded by an analog tape recorder, the recording can be performed without deterioration in the S/N ratio, distortion of the waveform and other such disturbances.

Thus, by constructing the signal processing circuit with an amplifier circuit, a multiplier circuit, and a band-pass filter circuit, and by selecting the gain of the signal processing circuit to be a predetermined value, an input/output characteristic can be obtained in which the amplitude compression ratio is changed slowly as the signal level of the input signal is increased and in which the amplitude compression action varies with the frequencies of the input signal.

Therefore, in accordance with the preferred embodiment the dynamic range of an audio signal having a wide dynamic range can be compressed while reducing the feeling of a lack of dynamic range.

Referring to FIG. 4, a low-pass filter circuit may be used in lieu of the band-pass filter described for the first preferred embodiment of the invention.

Figure 14:
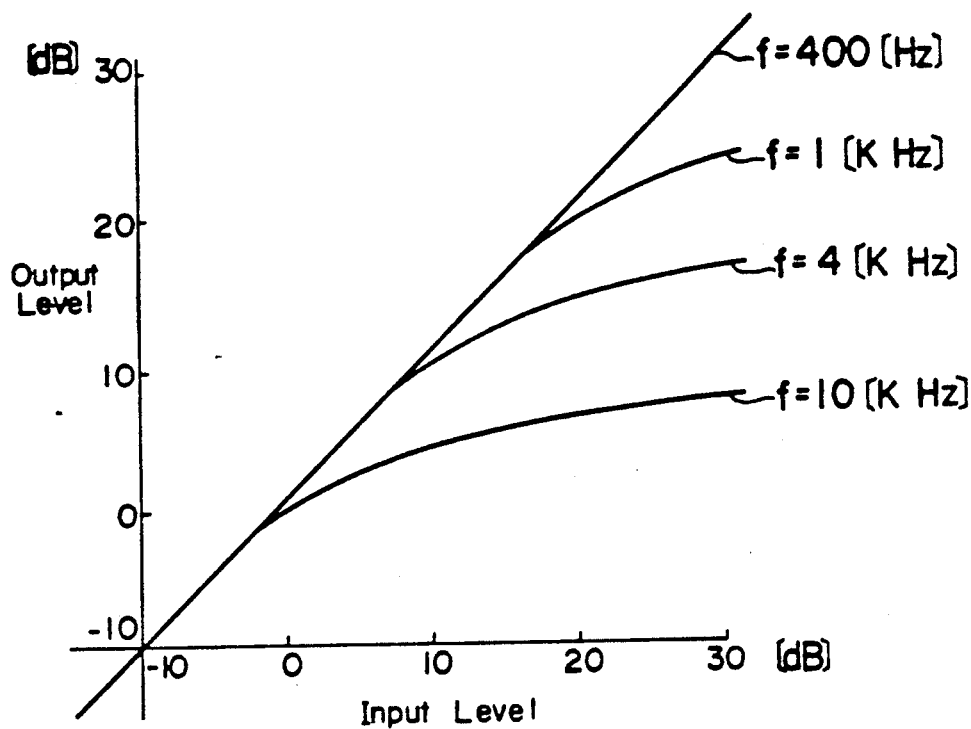
FIGS. 14 and 15 are characteristic curve diagrams used for explaining operations of amplitude compressing/expanding circuits according to other preferred embodiments.

In such altered configuration, an input/output characteristic can be obtained in which, as shown in FIG. 14, the higher the input signal frequency, the lower the range of the signal level of the input signal where the amplitude compression action starts.

Figure 15:
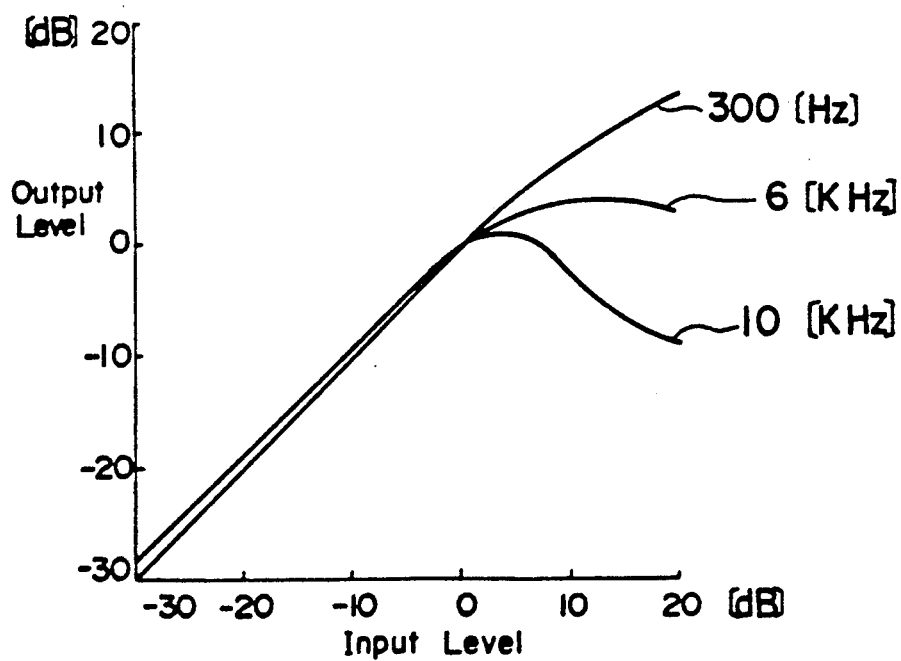

Referring to FIG. 15 a problem with a magnetic tape of an analog system is that the output level of the recorded signal is lowered when the frequency of the recorded signal becomes higher even if the signal level of the recorded signal is increased higher than a specific value due to self-demagnetizing action.

By supplying the recorded signal to the recording head through the amplitude compressing/expanding circuit according to the preferred embodiments, in which the higher the frequency of the input signal is, the earlier in the rise of the signal level of the input signal that the amplitude compressing operation is started, the lowering of the output level due to the self-demagnetizing action can be prevented.

Although, in the preferred embodiments described, a band-pass circuit of a low-pass filter circuit was used for the filter circuit, the present invention is not limited to such examples. A high-pass filter, trap filter, or the like also may be used as the need arises.

In addition, although in the embodiments described above the filter circuit was used for providing the amplitude compression function so as to vary with the frequencies of the input signal, the present invention is not so limited. The signal processing circuit also may be formed of only a multiplier circuit.

In such case, an amplitude compressing/expanding circuit can be obtained having an input/output characteristic in which the amplitude compression ratio varies smoothly across the threshold level.

The signal processing circuit also may be provided with either only the amplifier circuit or only the filter circuit.

When only the amplifier circuit is provided an input/output characteristic can be obtained by setting the gain of the amplifier circuit to a desired value to provide an amplitude compressing function only when the level of the input signal comes within a specific range.

In the case where only the filter circuit is used, when the signal level of the input signal is changed causing the signal level of the difference signal to change, the signal level of the difference signal component passed through the filter circuit to be added to the output signal of the main pass circuit correspondingly changes. As a result an input/output characteristic which provides a frequency characteristic varying with the signal level of the input signal can be obtained.

If a low-pass filter circuit is used for the filter circuit, the high-frequency component of the input signal can be emphasized. If a band-pass filter is used instead, the signal component of the pass band of the band-pass filter circuit can be emphasized.

As a result, if the arrangements of the above-described first and second preferred embodiments are modified so as to use only the filter circuit for signal processing effects similar to those obtained by the first and second preferred embodiments still may be obtained, even though simpler constructions as a whole are used.

A clipping circuit also may be used in the signal processing circuit. By such a circuit arrangement, the output signal from the signal processing circuit can be clipped at a predetermined signal level. Correspondingly, it is possible to provide a desired change to the input/output characteristic of the amplitude compressing/expanding circuit as a whole.

Although the above-described preferred embodiments were described for cases where the amplitude compression ratio CR was set to the value 1 in the range below the threshold point, the present invention is not so limited. The amplitude compression ratio CR below the threshold point can be set to values other than 1. To do so the circuit parameters are adapted so that a difference signal is obtained in the signal processing circuit when an input signal is input having a signal level above the threshold point, whereby an input/output characteristic can be achieved for changing the amplitude compression ratio CR smoothly from one in the range below the threshold point to a desired amplitude compression ratio.

If the amplitude compression ratio CR is set to a value less than 1 an input/output characteristic is obtained that provides an amplitude expanding function in the range below the threshold point and an amplitude compressing function in the range across the threshold point slowly changing from the amplitude expanding function.

Further, by setting the gain "A" to a value larger than 2 and using only the range above the threshold point, an input/output characteristic can be obtained which provides slowly changing functions starting from an amplitude expanding function at an amplitude compression ratio CR dependent upon the gain "A" and continuing to an amplitude compressing function at an amplitude compression ratio CR determined by an amplitude compression ratio control signal $S_G$.

Although the above preferred embodiments were described for cases where the control signal is produced according to the signal level of the input signal, the present invention is not limited to be applied to such an arrangement, but may be applied to an amplitude compressing/expanding circuit wherein the control signal is produced according to the signal level of the output signal.

Further, by disposing such an amplitude compressing/expanding circuit employing a low-pass filter circuit in front of an encoder in a digital audio signal processing system for the purpose of coding, the unpleasant sound to the ear due to quantization noise at the time of reproduction of female frictional sound, such as that formed by the female audio signal when "sa" is pronounced, can be prevented from occurring.

Figure 16:
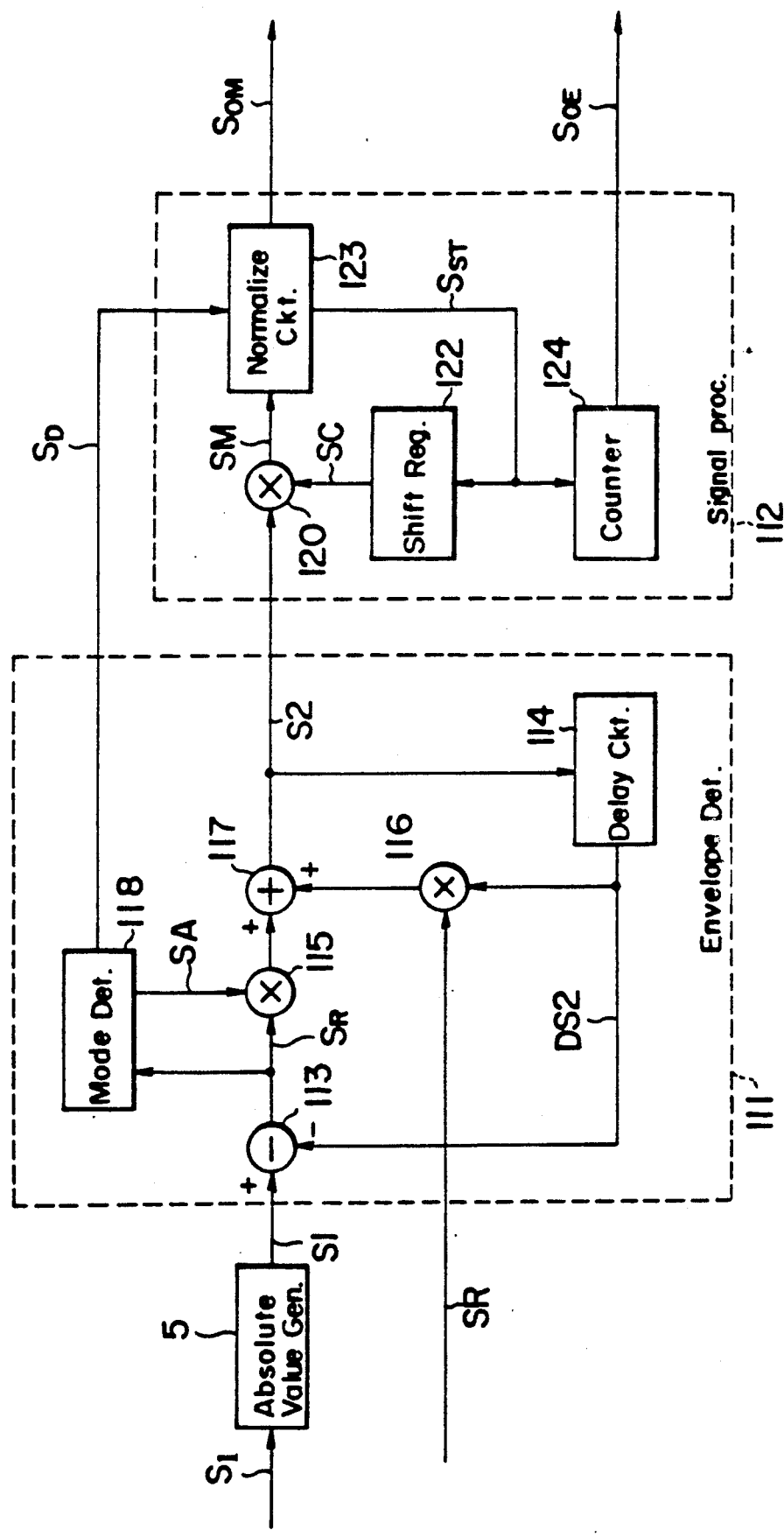
FIG. 16 is a schematic block diagram of one example of the control signal generator shown in FIG. 4.

Referring now to FIG. 16, a circuit arrangement of the control signal generator circuit 4 shown in FIG. 4 will be described in detail. In this circuit, digital information is supplied as the input signal $S_I$. Therefore, this control signal generator circuit performs digital signal processing.

In the control signal generator circuit of FIG. 16, a signal processing circuit 112 receives a signal S2 derived from an absolute value signal S1. Signal Sl is a sequence of digital information output from an absolute value circuit 5 into an envelope detector circuit 111. Signal S1 is processed at the envelope detector 111 to produce signal S2. The signal processor 112 processes signal S2 to produce normalized digital signals $S_{OM}$ and $S_{OE}$ which are output to the logarithmic converter circuit 7 (see FIG. 3).

Figure 17:
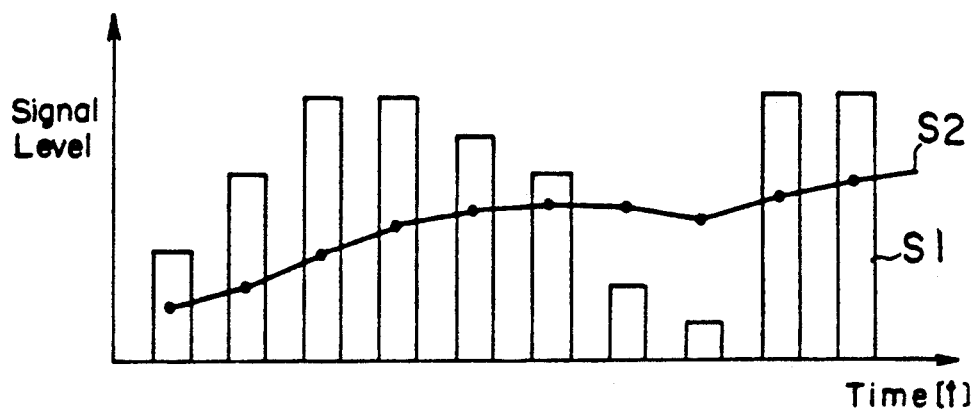
FIG. 17 is a characteristic curve diagram used for explaining operations of the amplitude compressing/expanding circuit shown in FIG. 16.

As shown in FIG. 17, the envelope detector circuit 111 sequentially receives the absolute value signal Sl, which is output from the absolute value circuit 5 based upon the digital audio signal $S_I$. The signal S1 is made up of 16 positive bits of two's compliment data. Signal S2 is a digital product signal which rises, or falls, in a predetermined attack time, or recovery time, dependent upon the variation in the absolute value signal SI.

Referring to the envelope detector circuit 111, a subtracter circuit 113 receives the absolute value signal Sl and a delayed envelope detection signal DS2. Signal DS2 is generated by a delay circuit 114 which delays by one clock period a digital product signal S2. The subtracter circuit 113 outputs a difference signal $S_R$, which is the difference between the absolute value signal S1 and the delayed envelope detection signal DS2, to both a multiplier circuit 115 and a mode detector circuit 118.

A positive difference signal $S_R$ is produced when the absolute value signal S1 is larger than that of the delayed envelope detection signal DS2, meaning that the amplitude of the digital audio signal $S_I$ is in an increasing condition.

Conversely, when the difference signal $S_R$ is negative, the value of the absolute value signal S1 is smaller than that of the delayed envelope detection signal DS2, the amplitude of the digital audio signal $S_I$ is in a decreasing condition.

A mode detector circuit 118 detects the value of the difference signal $S_R$. When the value of the difference signal $S_R$ is positive or zero (hereinafter to be referred to as the "attack mode"), the mode detector circuit 118 switches the value of an attack time control signal SA to set the gain of a multiplier circuit 115 to 0.02.

In contrast, when the value of the difference signal $S_R$ is negative (hereinafter to be referred to as the "recovery mode"), the gain of the multiplier circuit 115 is set to zero.

Thus in the attack mode an output signal is obtained from the difference signal $S_R$ multiplied by 0.02, in the recovery mode, the output signal is zero.

A multiplier circuit 116 receives the delayed envelope detection signal DS2 and a recovery time control signal SR, then outputs an output signal whose value is 0.9998 times as large as that of the delayed envelope detection signal DS2.

An adder circuit 117 adds up the output signals of the multiplier circuits 115 and 116 and outputs the summation as the digital product signal S2. Signal S2 then is output to the signal processing circuit 112 and the delayed circuit 114.

Figure 18:
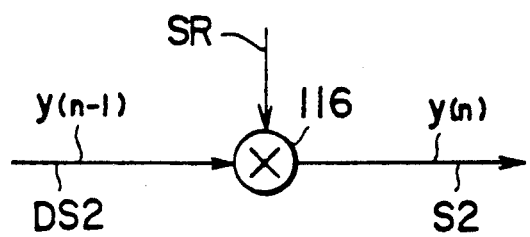
FIGS. 18 and 20 are schematic block diagrams for showing a portion of the circuit shown in FIG. 16.

The envelope detector circuit 111 in the recovery mode can be represented by an equivalent circuit as shown in FIG. 18. By denoting the value of the digital product signal S2 by y(n), the value of the delayed envelope detection signal DS2 by y(n−1), and the gain of the multiplier circuit 116 by $K_R$, a relationship as expressed below is obtained $$y(n) = K_r y(n-1) \dots \quad (3)$$

As a result, even when the absolute value signal S1 changes from its maximum value to minimum value, a digital product signal S2 that slowly decreases corresponding to the gain $K_R$ can be obtained. And in this case where the gain $K_R$ is selected to be 0.9998, even when the value of the digital product signal S2 was the maximum value and the value of the absolute value Sl is the minimum value only bit shifting of one bit position may be required to normalize the digital product signal S2 relative to the digital product signal S2 obtained one clock period before.

Figure 19:
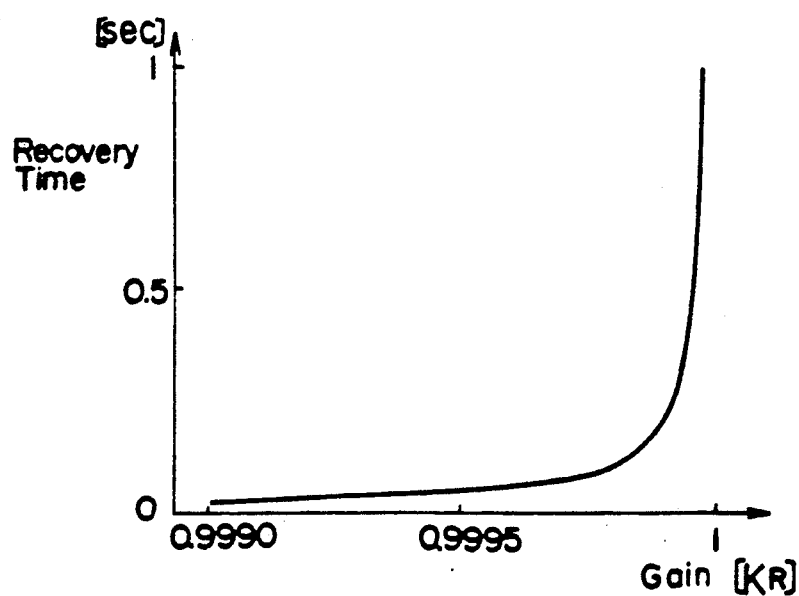
FIGS. 19 and 21 are characteristic diagrams used for describing the operation of the control signal generator illustrated in FIG. 16.

In practice, as illustrated in FIG. 19, since the sampling frequency in a CD player is set to 48 kHz, a recovery time of approximately 50 msec can be obtained by selecting the gain $K_R$ of the multiplier circuit 116 to be 0.9998.

Figure 20:
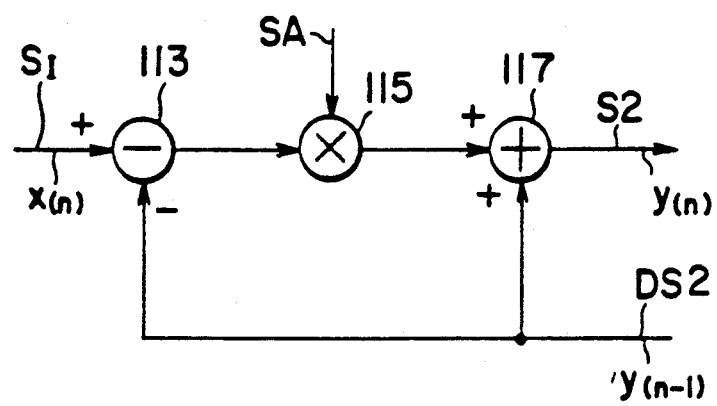

By contrast, in the attack mode, since the gain $K_R$ is expressed as $$\begin{aligned} K_R &= 0.9998 \\ &\approx 1 \end{aligned} \quad (23)$$

the circuit can be represented by an equivalent circuit as shown in FIG. 20. By denoting the gain of the multiplier circuit 115 by $K_A$ and the value of the absolute value signal S1 by x(n), a difference signal $S_R$ having a value $Z_{(n)}$ is expressed as $$Z_{(n)} = X_{(n)} - Y_{(n-1)} \dots \quad (24)$$

Therefore, a digital product signal S2 at the output of adder circuit 117 having a value y(n) is expressed as $$\begin{aligned} y(n) &= y(n-1) + Z_{(n)} \cdot K_A \\ &= y_{(n-1)} + \{x_{(n)} - y_{(n-1)}\} \cdot K_A \end{aligned} \quad (25)$$

Although the value of the digital product signal S2 has the greatest change when signal S2 was at a minimum value and an absolute value signal SI is input at maximum value, normalization of S2 is achieved by bit-shifting 9 bit positions at most relative to the digital product signal S2 obtained one clock period earlier. This is achieved by setting the gain $K_A$ of the multiplier circuit 115 to 0.02.

Figure 21:
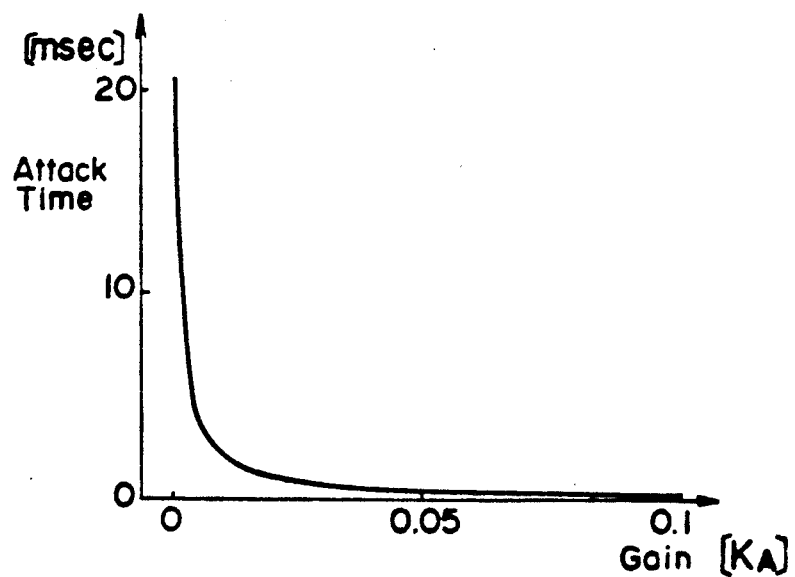

In practice, as shown in FIG. 21, because the gain $K_A$ of the multiplier circuit 116 is set to 0.02, a value around 1 msec can be obtained which is sufficient for the attack time.

Thus, a digital product signal S2 formed of a sequence of digital information can be obtained whose level varies in accordance with the amplitude of the absolute value signal S1 over the attack time and recovery time of 1 msec and 50 msec, respectively.

Referring again to FIG. 16 the signal processing circuit 112 receives the digital product signal S2 at a multiplier circuit 120 which outputs a digital product signal SM based upon a control signal SC output from a shift register 122. Signal SC is the result of a bit-shifting operation in the shift register 122 wherein the digital information of the digital product signal S2 is shifted by a quantity required to normalize the digital product signal S2 received one clock period before.

The shift register circuit 122, constructed of a 15-bit reversible shift register circuit, responds to a bit shift signal $S_{ST}$ output from a normalization circuit 123 to cause data of logical value "1" stored in the shift register circuit 122 to be shifted on one bit position at a time.

For a bit shifting operation of m-bit positions the contents of the shift register circuit 122 are arranged such that the logical value of the m-th bit from the least significant bit (LSB) is logical "1".

The shift register circuit 122, based upon such m-th bit level, outputs a control signal SC causing the multiplier circuit 120 to generate a digital product signal SM having a value $2^m$ times as large as that of the digital product signal S2 input to the multiplier circuit 120.

Since bit shifting by 9 bit positions or one bit position, at most, are required for normalization of the information processed one clock period before in the attack mode and recovery mode, respectively, the shifting is adapted so that input digital information having a bit length 9 bits longer (i.e 25 bits) than the bit length of the information input to the multiplier circuit 120 (i.e. 16 bits) is output to the normalization circuit 123.

Thus, the digital information forming the digital product signal SM and input to the normalization circuit 123 first is shifted "m" bit positions to normalize the digital information relative to the digital information processed one clock period before.

The normalization circuit 123 receives a mode detection signal $S_D$ from the mode detector circuit 118 of the envelope detector circuit I!1 to identify either the attack mode or the recovery mode. The circuit 123 normalizes, as shown in FIG. 22, the digital product signal SM according to the mode detection signal $S_D$ so that the logical value of the second bit from the most significant bit (MSB) of a 16-bit data word is at a logical "1" (FIG. 22(A)).

More particularly, in the attack mode the digital product signal SM input to the normalization circuit 123 is shifted so that the logical values of the bits in the two highest positions of the 25-bit long data word are logical "0" and "1" (FIG. 22 (B)) or are both "0" (FIG. 22(C)).

Then, the normalization circuit 123 detects the logical value of the second bit from the most significant bit, and shifts the digital information toward the higher order until the logical value of the bit in question is at a logical "1".

Further, the circuit 123 outputs the bit shift signal $S_{ST}$ (see FIG. 16) corresponding to the number of bits shifted and at the same time, outputs the most significant 16 bits to the logarithmic converter circuit 7 (FIG. 3) as the mantissa of envelope detection signal $S_{OM}$.

In the recovery mode, as shown in FIG. 23, the logical values of the digital product signal SM bits from the most significant bit to the tenth bit of the 25-bit long data are logical "0" while the logical value of the 11th bit is logical "1" (FIG. 23(A)). Alternatively, the logical values of the bits from the most significant bit to the 11th bit are logical "0" in succession and the logical value of the 12th bit is logical "1" (FIG. 23 (B)).

The normalization circuit 123, in the recovery mode, detects the logical value of the 11th bit from the most significant bit. When the logical value of that bit is logical "0", bit shifting a bit shift of one bit position toward the most significant bit occurs.

The normalization circuit 123 then outputs the 16 least significant bits as the exponent of the normalized data. Thus, the exponent of the normalized envelope detection signal $S_{OM}$ in both attack mode and recovery mode can be obtained.

Because of the prior bit shifting by the bit-shift quantity "m" required for normalization of the digital product signal SM processed one clock period before, normalization of the digital product signal SM in the attack mode is achieved by shifting 9 bit positions at most and normalization of the digital product signal SM in the recovery mode is achieved by shifting one bit position at most.

Therefore, as compared with the prior art case where digital information is sequentially normalized, the number of bit shifts in the present case can be reduced according to the shifting performed one clock period earlier for normalization.

As a result, the processing time required for the bit shifting correspondingly is shortened and the processing is simplified, enabling a signal processing circuit of a simplified circuit arrangement.

Referring to FIG. !6, a counter circuit 124, formed of a reversible counter, increases or decreases the count value obtained one clock before in response to the bit shift signal $S_{ST}$. As a result, the exponent of the envelope detection signal $S_{OE}$ corresponding to the mantissa of the envelope detection signal $S_{OM}$ obtained one clock period before is updated and output to the logarithmic converter circuit 7 (FIG. 3).

At the same time, the shift register circuit 122 shifts the bit of logical value "1" according to the bit shift signal $S_{ST}$ and records the bit shift quantity required for normalization of the digital information in the current clock period.

Figure 3:
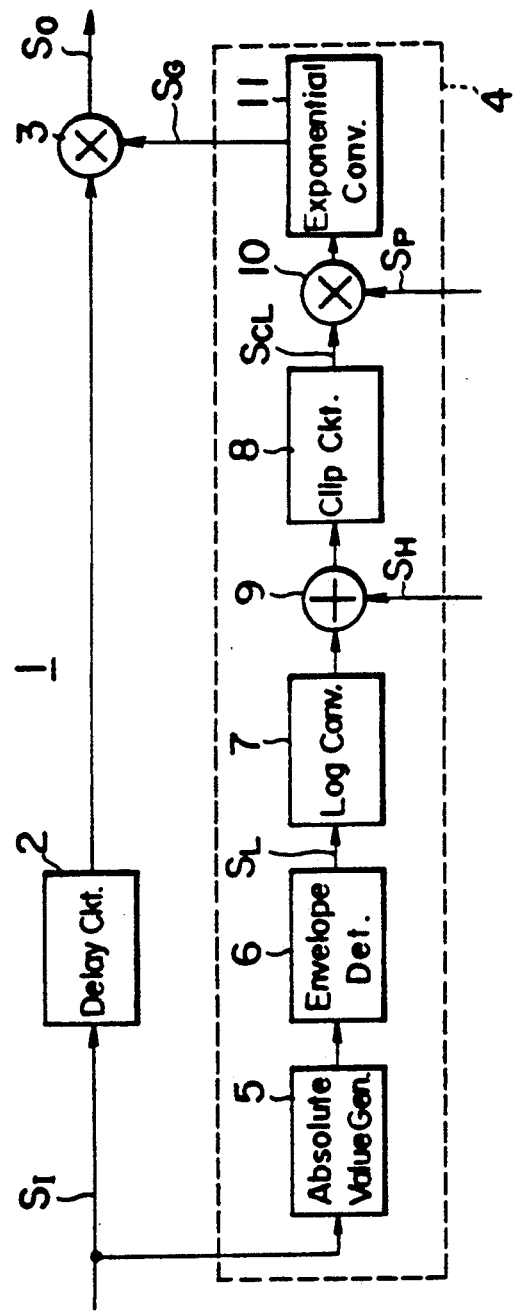

In the described manner, the envelope detection signals are output as exponent signal $S_{OE}$ and mantissa signal $S_{OM}$ and passed through the logarithmic converter circuit 7, clipping circuit 8, multiplier circuit 10, and the exponential converter circuit 11 (FIG. 3). As a result, a specified control signal $S_G$ can be obtained and thus, a control signal generator circuit is achieved for producing small calculation error as a whole with high speed processing in a simplified circuit arrangement.

In the described circuit arrangement, the digital audio signal $S_I$ is converted into the absolute value signal S1 and then input to the envelope detector circuit 111.

As a result, the digital product signal S2 varying in predetermined attack time or recovery time is obtained through the envelope detector circuit 111.

In the signal processing circuit 112, the digital product signal S2 is subjected to bit shifting by (1) the bit-shift quantity required for normalizing the digital product signal S2 received one clock period before, and (2) the bit shifting in the normalization circuit 123 according to whether in the attack mode or recovery mode.

As a result, the mantissa and exponent information of the digital product signal S2 are obtained in the normalization circuit 123 and the counter circuit 124, respectively, and output from the signal processing circuit 112.

According to the above described circuit arrangement, a signal processing circuit performing the signal processing in a simple manner and shorter processing time with a simpler circuit arrangement as a whole can be obtained by virtue of the normalization of signal S2 performed one clock period earlier.

Therefore, a control signal generator circuit of a correspondingly simpler circuit arrangement as a whole, producing smaller errors, and capable of speedier operational processing can be obtained.

Although the above embodiment was described for the case where the attack time and the recovery time are set to 1 msec and 50 msec, the present invention is not limited thereto, but may be widely applied to other cases in which a digital signal varying in attack time and recovery time is subjected to a normalization process in floating point arithmetic.

For a case where the attack time and recovery time are changed, the bit length of the digital information input to the normalization circuit may be suitably selected in accordance with the changed attack time and recovery time. The corresponding bit shifting processes then are performed in the normalization circuit.

Subsequently, a control signal generator circuit according to another preferred embodiment will now be described with reference to FIG. 24.

Figure 24:
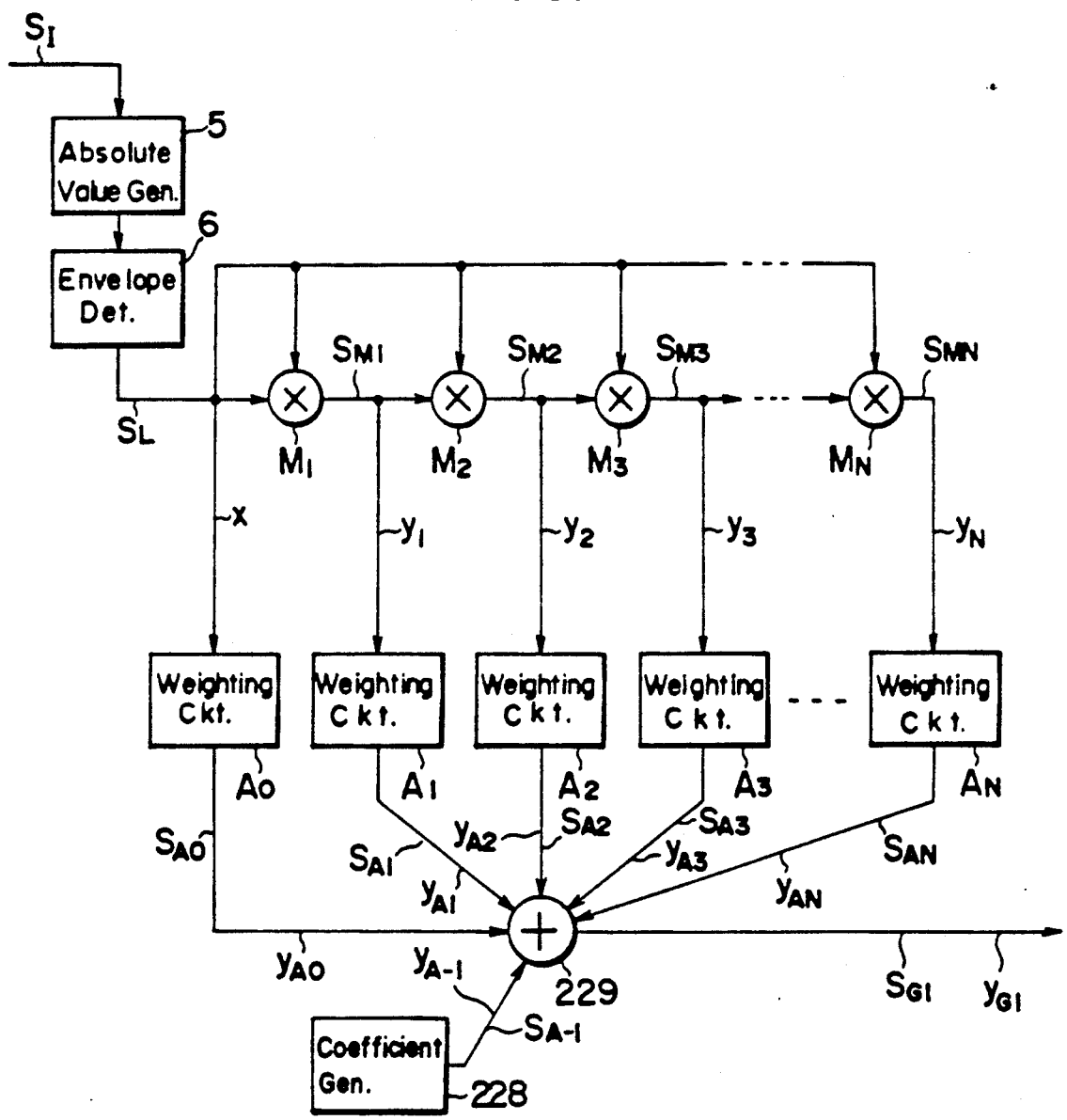
FIG. 24 is a schematic block diagram of a control signal generator according to another preferred embodiment.

In FIG. 24, an input signal $S_I$ composed of a digital audio signal having an amplitude "X" is supplied via an absolute value circuit 5 to an envelope detector 6. A detected signal $S_L$ is output from the envelope detector circuit 6 having a signal level proportional to the signal level "X" of the input signal $S_I$. Multiplier circuits $M_1$, $M_2$, $M_3$, ---, $M_N$ (N being an integer) are connected in series to form N-series-connected multiplier circuits. Each multiplier circuit receives the detected signal $S_L$ at its respective input terminal. The detected signal $S_L$ controls the gain of each respective multiplier circuit. The detected signal S: also is supplied at the multiplier circuit $M_1$ to the N-series-connected multiplier circuits.

Assuming that the signal level of the detected signal $S_L$ is in direct proportion to the signal level "X" of the input signal $S_I$ at a proportion constant of 1, a signal level "$y_1$" of a multiplier signal $S_{M1}$ is obtained from the multiplier circuit $M_1$ and expressed as:

$$y_1 = x^2 \ldots \quad (26)$$

In the succeeding multiplier circuit $M_2$ a signal level "$y_2$" of multiplier signal $S_{M2}$ is obtained as represented by the following equation:

$$\begin{aligned} y_2 &= y_1 \cdot x \\ &= x^3 \end{aligned} \quad (27)$$

For each of multiplier circuits $M_1$ through $M_N$, the signal levels $y_1$, $y_2$, $y_3$, ---, $y_N$ of the respective multiplier signals $S_{M1}$, $S_{m2}$, $S_{M3}$, ---, $S_{MN}$ can be produced as expressed by the following generic formulae:

$$\begin{aligned} Y_n &= Y_{n-1} \cdot x \\ &= Y_{n-2} \cdot x^2 \\ &= : \\ &= Y_1 \cdot x^{n-1} \\ &= x^{n+1} \\ n &= 1, 2, 3, \ldots, N \end{aligned} \quad (29)$$

With the above-described arrangement, both the absolute value circuit 5 and envelope detector circuit 6 constitute the detector means for detecting the signal level of the input signal $S_I$. The multiplier circuits $M_1$ through $M_N$ constitute a multiplier means for performing multiplication on the detector results at a predetermined multiplication number with a coefficient defined in accordance with the detector results obtained from the detector means.

Referring again to FIG. 24, the control signal generator circuit also includes (N+1) sets of weighting circuits $A_0$, $A_1$, $A_2$, $A_3$, ---, $A_N$ respectively constructed of amplifier circuits. The signal $S_L$ and the respective multiplier signals $S_{M1}$, $S_{M2}$, $S_{M3}$, ---, $S_{MN}$ are input to respective weighting circuits. The output of each weighting circuit is input to the adder circuit 229.

Accordingly when the weighting coefficients of the respective weighting circuits $A_0$, $A_1$, ---, $A_N$ are express by values $C_0$, $C_1$, $C_2$, $C_3$, ---, $C_N$, an output signal $S_{AO}$ having a signal level $y_{AO}$ can be obtained via the first weighting circuit $A_O$ which is represented by the following equation:

$$y_{AO} = C_O x \ldots \quad (30)$$

In the remaining weighting circuits $A_1$ to $A_N$, output signals $S_{A1}$, $S_{A2}$, $S_{A3}$, ---, $S_{AN}$ having a signal level $y_{A1}$, $y_{A2}$, $y_{AN}$, respectively, can be obtained which are generally expressed by the following equation:

$$\begin{aligned} y_{AN} &= C_n Y_n \\ &= C_n x^{n+1} \end{aligned} \quad (31)$$

The adder circuit 229 receives the above described output signals $S_{AO}$ to $S_{AN}$, along with a signal $S_{A-1}$ having a signal level $y_{A-1}$ derived from a coefficient generator circuit 228 (the signal level of which corresponds to a signal level expressed by a value $C_{-1}$ corresponding to the output signals $S_{AO}$ to $S_{AN}$). The adder circuit outputs a resultant adder signal as a control signal $S_{G1}$.

As a consequence, a control signal $S_{G1}$ having a signal level $y_{G1}$ is produced as an output from the adder circuit 229 based upon the above-described equations (30) and (31), as expressed by the following equations.

$$\begin{aligned} y_{G1} &= C_{-1} + y_{A0} + \sum_{n=1}^{N} y_{An} \\ &= C_{-1} + C_0 x + C_1 x^2 + C_2 x^3 \\ &= \ldots + C_N x^{N-1} \\ &= \sum_{n=-1}^{N} C_n x^{n+1} \end{aligned}$$

As previously described in detail, the weighting circuits $A_O$ to $A_N$ constitute weighting means for weighting the detected signal $S_L$ and the multiplied signals $S_{M1}$ to $S_{MN}$ by predetermined weighting amounts, whereas the adder circuit 229 constitutes adder means for summing the output signals $S_{AO}$ to $S_{AN}$ obtained by the weighting operations.

Consequently, when the amplitude compressing/expanding circuit is constructed of the above-defined circuit arrangement by setting the weighting circuits $A_O$ to $A_N$ and the weighting coefficients $C_1$ to $C_N$ of the coefficient generator circuits 228 to predetermined values, the input/output characteristics indicated by the high order function formula can be obtained. As a result, input/output characteristics can be obtained with a simple circuit arrangement while having an amplitude compression ratio which varies complexly.

Figure 25:
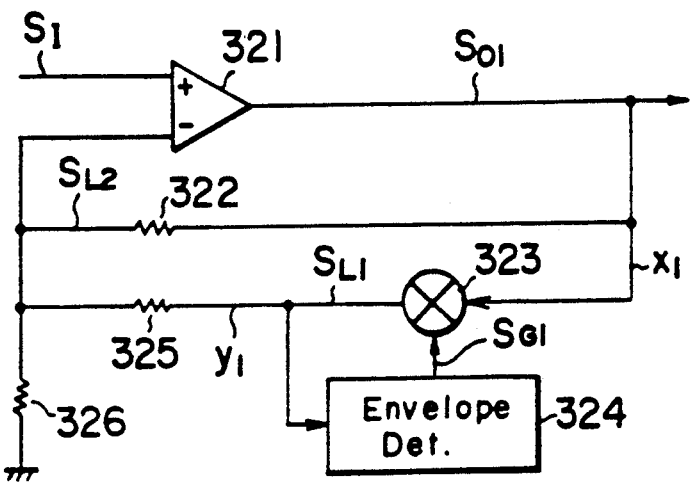
FIG. 25 is a circuit diagram of a portion of the amplitude compressing/expanding circuit shown in FIG. 4.

Referring to FIG. 25, another preferred embodiment of the multiplier circuit 3 and control signal generator 4 shown in FIG. 4 will be described.

In FIG. 25, reference numeral 320 represents both the multiplier circuit 3 and the control signal generator 4 illustrated in FIG. 4. This circuit arrangement receives, as an input signal, a voice signal $S_I$ at a non-inverting input terminal of an operational amplifier circuit 321. The amplifier circuit 321 has a gain of more than 50 dB and provides at the output terminal an amplitude compressed, expanded, or expanded and compressed output signal $S_{O1}$.

The operation amplifier circuit 321 uses a resistor 322 functioning as a first feedback circuit for maintaining the amplifier gain at a constant value even when the signal level of the output signal $S_{O1}$ is changed. The operational amplifier circuit 321 uses a second feedback circuit which is constructed of a multiplier circuit 323 and an envelope detector circuit 324. The multiplier circuit 323 has an amplitude gain which is increased when the signal level of the output signal $S_{O1}$ is increased, while the envelope detector circuit 324 controls the amplitude gain of this multiplier circuit 323.

More specifically, the envelope detector circuit 324 responds to the output signal $S_{L1}$ to produce a control signal $S_{G1}$ in direct proportion to the output signal $S_{L1}$ so as to control the amplitude gain of the multiplier circuit 323. As a result, the input/output characteristics of the multiplier circuit 323 can be changed in response to the signal level of the output signal $S_{O1}$.

The output signal $S_{L1}$ of the multiplier circuit 323 is supplied via a resistor 325 to the operational amplifier circuit 321 at the non-inverting input terminal together with the output signal $S_{L2}$ of the resistor 322. Thus, a summation signal derived from the first and second feedback circuits is fed back to the operational amplifier circuit 321. A resistor 326 connects the non-inverting input terminal to ground.

Figure 26:
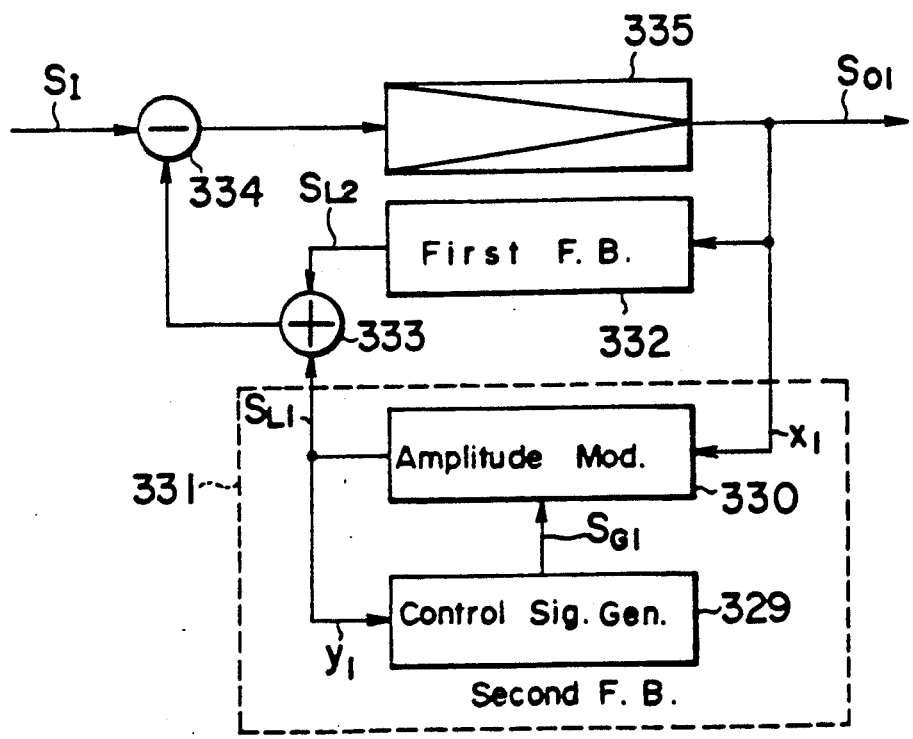
FIG. 26 is a schematic block diagram for illustrating an equivalent circuit for the circuit shown in FIG. 25.

Representing circuit 320 with an equivalent circuit, the envelope detector circuit 324 constitutes a control signal generator circuit 329, while the multiplier circuit 323 constitutes an amplitude modulator circuit 330, the two circuits together representing a second feedback circuit 331. The amplitude gain of the modulator circuit 330 is varied in accordance with the control signal $S_{G1}$ output from the control signal generator 329. The first feedback circuit 322 of FIG. 25 is constituted by a first feedback circuit 332 in FIG. 26.

The resistor 326 constituted by an adder circuit 333 for adding the output signals $S_{L1}$ and $S_{L2}$ of the first and the second feedback circuits 332 and 331, respectively. The operational amplifier circuit 321 of FIG. 25 is constituted by a subtracter circuit 334 which subtracts the output signal of the adder circuit 333 from the voice signal $S_I$, along with an amplifier circuit 335 having a predetermined gain.

Accordingly, the circuit 320 may be constructed of a feedback amplifier circuit including two feedback circuit 331 and 332, so that the input/output characteristics of both the first and second feedback circuits 332 and 331 determine those of the entire circuit 320.

It should be noted in the circuit 320 shown in FIG. 25 that the feedback gains of the first and second feedback circuits may be equal for a voice signal $S_I$ having a predetermined signal level. Simultaneously, the total gain of the circuit 320 may be set to a value of 1 in the first feedback circuit 332.

As a consequence, input/output characteristic for circuit 320 can be obtained which are determined by the input/output characteristic of the first or second feedback circuit 332 or 331 at the boundary of the signal level. With an increase in the signal level of the voice signal $S_I$ at the boundary of the signal level, the signal level of the output signal is increased, and the amplitude gain of the multiplier circuit 323 is correspondingly increased, so that the circuit 320 can be determined from the first feedback circuit 332 and second feedback circuit 321. Accordingly, if the input signal level is set to the signal level obtained at the threshold point, the input/output characteristic of circuit 320 becomes the input/output characteristic determined by the first and second feedback circuits 332 and 331 at the boundary of the threshold point.

In addition, since the summation signal derived from the first and second feedback circuit 332 and 331 is fed back, the input/output characteristic determined by the first feedback circuit 332 at the boundary of the threshold point, can be varied to equal the input/output characteristic determined by the second feedback circuit 331.

Accordingly, for selected input/output characteristics of both the first and second feedback circuits 332 and 331, the input/output characteristic of the circuit 320 can be smoothly changed from the input/output characteristic determined by the first feedback circuit 332 to the input/output characteristic determined by the second feedback circuit 331.

Equating the amplitude of the output signal $S_{O1}$ to a value of $x_1$, the amplitude of the output signal $S_{L1}$ derived from the multiplier circuit 323 to a value of $y_1$, and the gain of the multiplier circuit 323 to a value of $g_1$, y, then can be expressed as:

$$y_1 = g_1 x_1 \quad\quad (33)$$

If in the envelope detector circuit 324, the proportion constant is equal to a value of "m", g, can be expressed as:

$$g_1 = m\, y \quad\quad (34)$$

Now, if the proportional constant "m" is equal to a value of 1, the following equation is obtained from the equations (33) and (34);

$$y = y\, x \quad\quad (35)$$

Accordingly, when the equation (35) is simplified, the following equation is given;

$$x = 1 \quad\quad (36)$$

Figure 27:
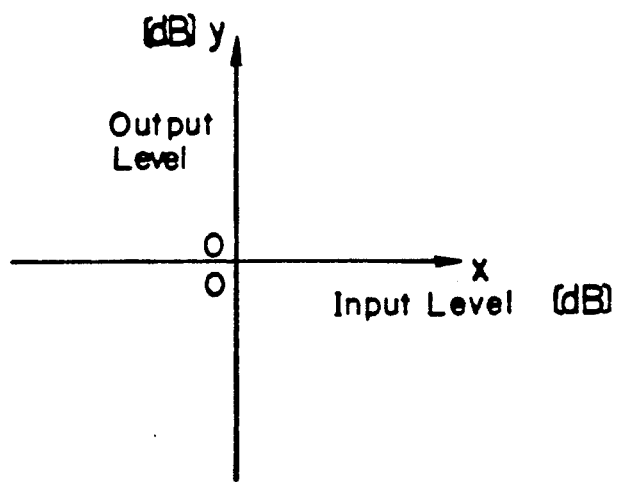
FIG. 27 to 30 are characteristic curve diagrams used for explaining the operations of the circuit shown in FIG. 25.

As a consequence, as illustrated in FIG. 27, the input/output characteristic for the amplitude gain of the second feedback circuit 331 can be obtained in which the output level is changed to infinity with respect to the input level.

Figure 28:
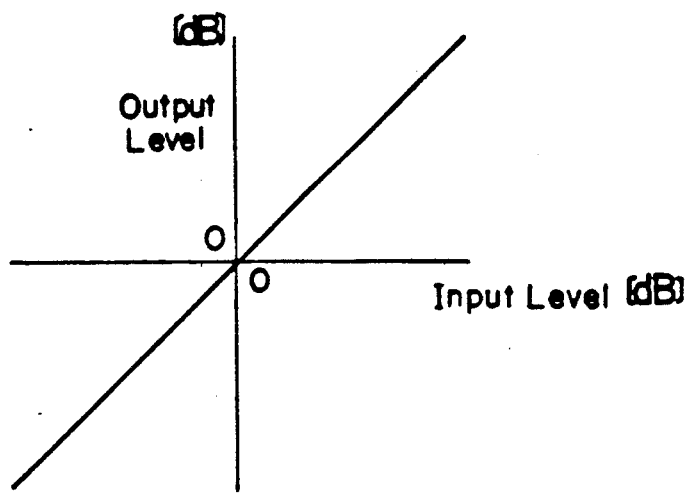

To the contrary, as shown in FIG. 28, in the first feedback circuit 332, an input/output characteristic can be obtained in which the output level is changed in direct proportion to the input level at a proportional constant of 1.

Figure 29:
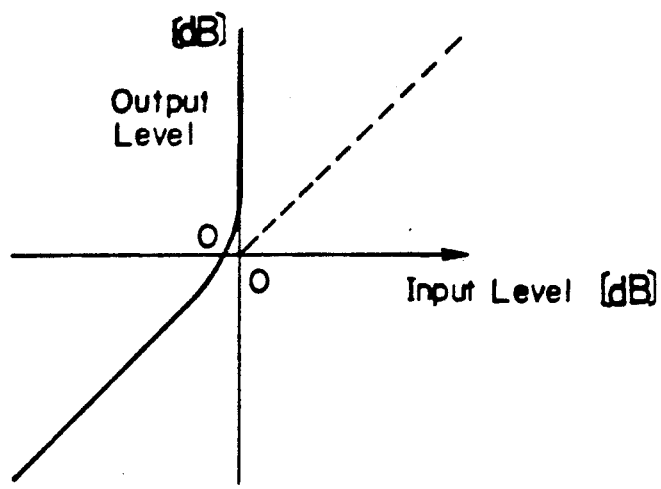

As a result, the input/output characteristic illustrated in FIG. 29 can be obtained at the boundary of the input level at which both the output levels of the first and second feedback circuits 332 and 331 become equal. That is, the input/output characteristic is smoothly changed from the input/output characteristic of the first feedback circuit 332, as described in FIG. 23, to that of the second feedback circuit 331 in accordance with an increase of the input level.

Figure 30:
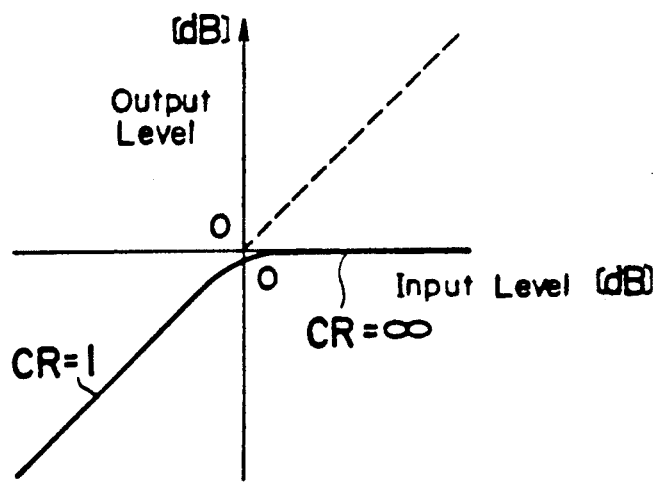

Consequently, the input/output characteristic of the entire circuit 320 is expressed by the reverse characteristic of the first and second feedback circuits 322 and 321, as illustrated in FIG. 30. The amplitude compression ratio CR can be smoothly varied with respect to the boundary of the threshold point (0 dB at the input signal in the preferred embodiment), from a value of 1 represented by the proportional constant of "1" to the infinite value represented by the proportion constant of "0".

Moreover, in the preferred embodiment, the first feedback circuit 332 is constructed of a resistor circuit, and the second feedback circuit 331 is constructed of the envelope detector circuit 324 for controlling the gain of the multiplier circuit 323. As a result the amplitude gains of the first and second feedback circuits 332 and 331 can be set with an extremely high accuracy.

As a consequence, the signal level at the threshold level can be set with a high accuracy, and since the entire circuit is constructed of the feedback circuits, the higher stability can be achieved as a whole, for the temperature, supply voltage and so on.

In a practical case, according to the conventional amplitude compressing/expanding circuit, the signal level at the threshold point must be set by the circuit network employing the non-linear circuit element such as the clipping circuit. As a result, there is no effective solution to prevent the fluctuation in the operation level of the non-linear circuit element. Also there is a problem that the temperature characteristics are not sufficiently stable.

However, according to the preferred embodiment of the invention, these conventional problems can be effectively solved.

With the above-described circuit arrangement, for the case where the signal level of the voice signal S is lower than the threshold point, the entire input/output characteristic of the circuit 320 can be set by the amplitude gain of the resistor 322 to achieve the input/output characteristic where the amplitude compression ratio CR is equal to a value of 1.

When the signal level of the voice signal $S_I$ is gradually increased, the amplitude compression ratio CR is gradually changed due to the amplitude gain of the second feedback circuit 331. When the signal level of the voice signal $S_I$ exceeds the threshold point, the input/output characteristic where the amplitude compression ratio CR becomes infinite can be obtained through the second feedback circuit 331.

According to the above-described circuit arrangement, the second feedback circuit is employed with respect to the first feedback circuit so that the entire circuit can be simply constructed, and the input/output characteristic is obtained in which the amplitude compression ratio CR is smoothly varied from the value of 1 to the infinitive value.

In addition, according to the preferred embodiment of the invention, since the entire input/output characteristic of the circuit 320 can be determined by the summation signal of the first and second feedback circuits the amplitude compression ratio CR can be changed with respect to the desired threshold point. As a consequence, the threshold point can be set with high accuracy relative to the conventional circuit arrangement, and an amplitude compressing/expanding circuit is obtained having stable temperature characteristic.

Figure 31:
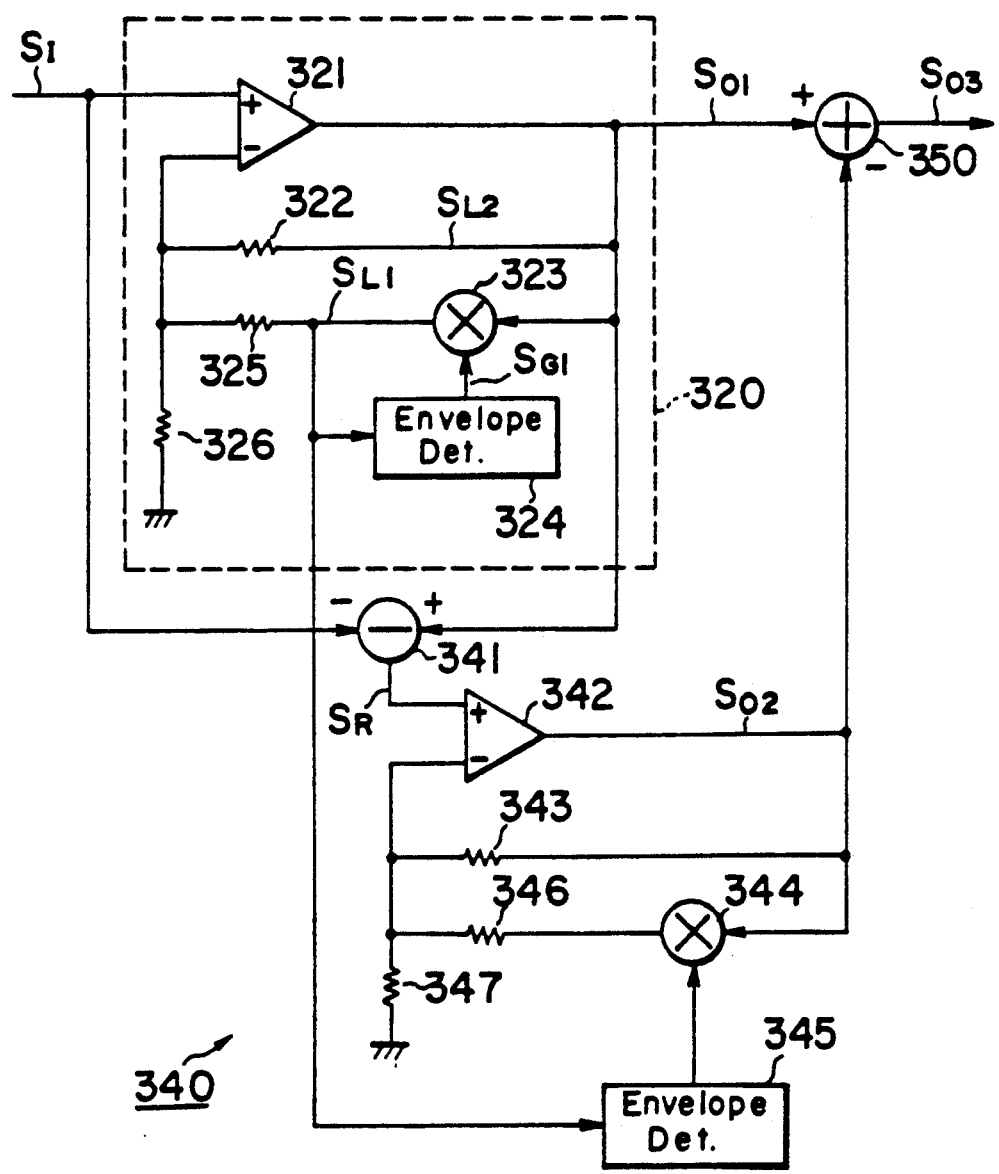
FIG. 31 is a schematic block diagram of an amplitude compressing/expanding circuit according to another preferred embodiment of the invention.

Referring to FIG. 31, a circuit arrangement is described in which the circuit of FIG. 25 is employed in the preferred embodiment of FIG. 4.

The same reference numerals are employed in FIG. 31 for denoting the same of similar circuit elements of FIG. 25. Reference numeral 340 indicates as a whole an amplitude compressing/expanding circuit. A main signal pass circuit 320 is constructed of the circuit 320 shown in FIG. 25. A signal subpass circuit is employed with the main pass circuit.

In the signal sub-pass circuit a subtracter circuit 341 receives the output signal $S_{O1}$, from the operational amplifier circuit 321 of the main signal pass circuit 320 and the voice signal $S_I$ to generate a difference signal $S_R$ received by a noninverting input terminal of an operational amplifier circuit 342.

The operation amplifier circuit 342, which is similar to the operational amplifier circuit 321, uses a first feedback circuit and a second feedback circuit. The first feedback circuit is constructed of a resistor 343. The second feedback circuit is constructed of a multiplier 344, an envelope detector 345 and a resistor 346. The envelope detector circuit 345 controls the gain of the multiplier circuit 344. The first and second feedback circuit outputs are summed and input to the inverting input of amplifier 342. The inverting input is connected to ground through resistor 347. The operational amplifier circuit 342 outputs signal $S_{O2}$ which is fed back to the inverting input terminal via the resistors 343 and 346.

The envelope detector circuit 345 receives the output signal $S_{L1}$ of the multiplier circuit 323 of the main pass circuit and charges the gain of the multiplier 344 based on such signal $S_{L1}$ similar to the control of the gain for multiplier 323 of the main pass circuit.

Furthermore, the resistance values of the resistors 343, 346 and 347 are selected in such a manner that the input/output characteristic of the operational amplifier circuit 342 is equal to the input/output characteristic of the operational amplifier circuit 321.

The adder circuit 350 of FIG. 31 outputs a summation signal of the output signals $S_{O1}$ and $S_{O2}$ of the operational amplifier circuits 321 and 342 as the output signal $S_{O3}$ of the amplitude compressing/expanding circuit 340.

Figure 32:
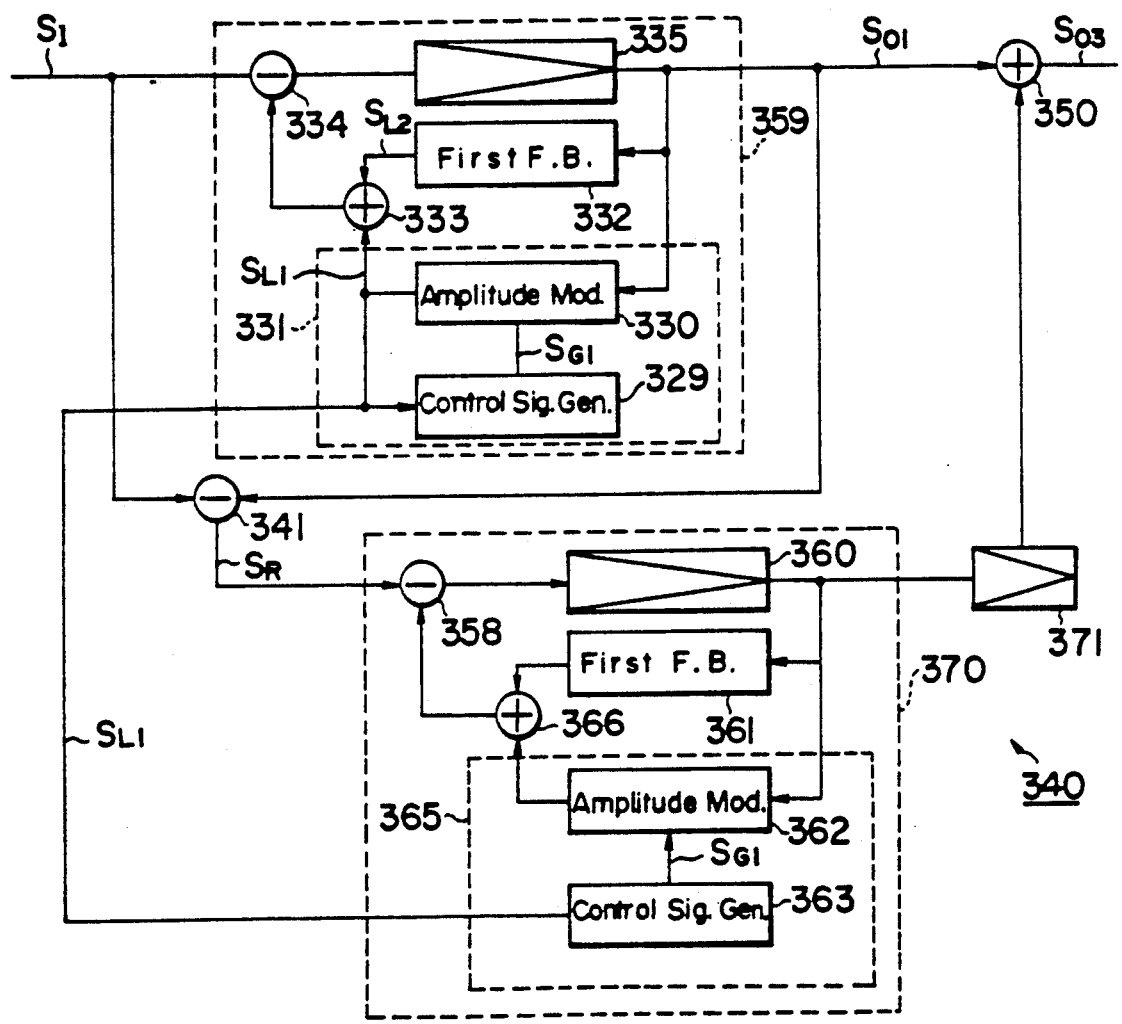
FIG. 32 is a schematic block diagram of an equivalent circuit for the circuit shown in FIG. 31.

Referring to FIG. 32, the circuit arrangement of FIG. 31 is expressed as an equivalent circuit. Comparing FIGS. 26 and 32, like reference numeral denote like circuit elements. With regard to the circuit of FIG. 31 the circuit 320 is constituted by the main pass circuit 359, whereas the sub-pass circuit in FIG. 31 comprising elements 342-347 is constituted by a sub-pass circuit 370 and amplifier 371.

With respect to the sub-pass circuit of FIG. 31, the resistor 343 is constituted by the first feedback circuit 361 in FIG. 32, the multiplier circuit 344 is constituted by the amplitude modulator circuit 362 and the envelope detector circuit 345 is constituted by the control signal generator circuit 363. Thus the amplitude modulator circuit 362 and the control signal generator circuit 363 constitute a second feedback circuit 365.

The resistors 346 and 347 are constituted by the adder circuit 366. The operational amplifier circuit 342 is constituted by subtracter 358 and amplifier 360. The gain of the sub-pass circuit 370 is changed like the gain in the main pass circuit 359, (i.e. in response to the input signal $S_I$ and output signal $S_{O1}$ of the main pass signal 359, and the difference signal $S_R$.) The amplifier circuit 360 output signal, via the amplifier circuit 371 having a predetermined gain, is supplied to adder circuit 350 where it is added to the output signal $S_{O1}$ of the main pass circuit 359 to provide a summation signal $S_{O3}$.

As a consequence, because control signal $S_{G1}$ is produced in control signal generator circuits 329 and 363 based upon the output signal $S_L$ of the amplitude modulator circuit 330 of the main pass signal 359, the circuit arrangement shown in FIG. 32 is equivalent to the circuit formed by eliminating the filter circuit 23 from the circuit arrangement shown in FIG. 4 when the main pass circuit 359 and the sub-pass circuit 370 are represented as the multiplier circuit, the input/output characteristic of which is changed in response to the signal level of the input signal.

In other words, both the main pass circuit 359 and subpass circuit 370 are represented as the multiplier circuits 375 and 376, respectively. The gains of these multiplier circuits 375 and 376 are changed by means of the control signal $S_{G2}$. The amplitude compression ratio CR then is equal to a value of 1 in the range below the threshold point, and is equal to an infinite value in the range above the threshold point.

Figure 33:
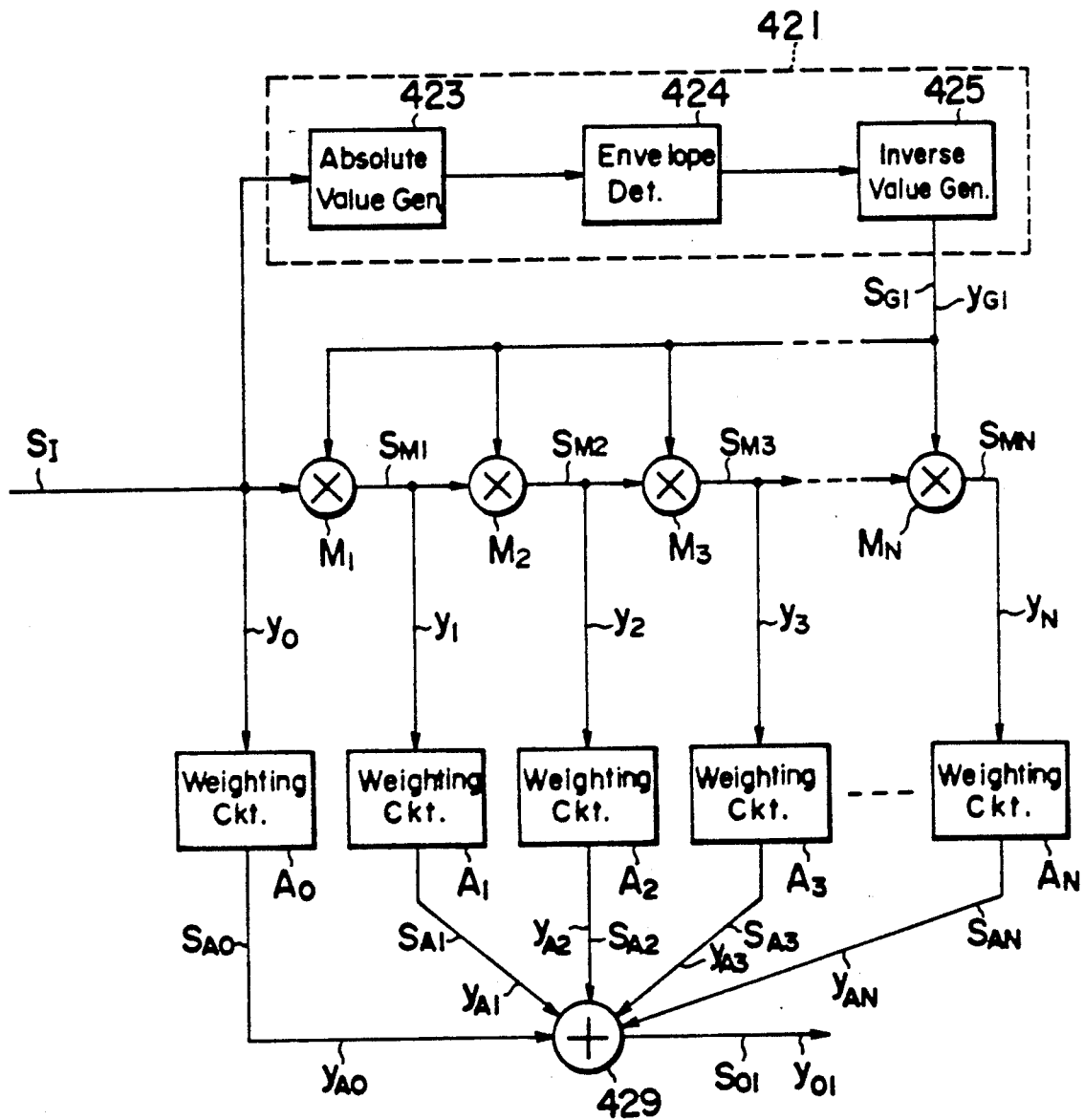
FIG. 33 is a schematic block diagram of an amplitude compressing/expanding circuit according to a modified preferred embodiment of the invention; and, FIG. 34 is a characteristic curve diagram used for explaining operations of the circuit shown in FIG. 33.

Referring now to FIG. 33, a still further preferred embodiment of the invention will be described by changing the representing method and moreover the circuit arrangement of the embodiment shown in FIG. 4.

In FIG. 33, reference numeral 420 represents an amplitude compressing/expanding circuit. An input signal $S_I$ constructed of a digital audio signal is received by a control signal generator circuit 421, a multiplier circuit $M_1$, and a weighting circuit $A_O$.

The control signal generator circuit 421 is operated in such a manner that the input signal $S_I$ is received at an absolute value circuit 423 for full wave rectifying the input signal. The rectified signal signed then is input to an envelope detector circuit 424 then a reciprocal inverting circuit 425 which outputs a detected signal $S_L$ directing proportional to the input signal as a control signal $S_{G1}$.

The control signal $S_{G1}$ is supplied from the signal generator 421 with a signal level $Y_{G1}$ expressed by the following equation (37) in which proportion constant "$a_1$" represents the proportion of the amplitude x of the input signal "$S_I$";

$$Y_{G1} = \frac{1}{a_1 \cdot x} \tag{37}$$

The control signal $S_{G1}$ is supplied to N-series-connected multiplier circuit $M_1$, $M_2$, $M_3$, ..., $M_N$ so as to control gains of each series-connected multiplier circuit $M_1$ through $M_N$.

As a result, the respective multiplier circuits $M_1$ to $M_N$ perform multiplier processing on the input signal by utilizing a gain equal to a coefficient $x^{-1}$ as represented by the below-mentioned equation (38):

$$g = x^{-1} \tag{38}$$

At multiplier circuit $M_1$ signal $S_I$ is input, denoted by the following equation:

$$y_0 = x \tag{39}$$

At multiplier circuit $M_1$, the multiplied signal $S_{M1}$ with amplitude $Y_1$ is obtained as an output represented by the following equation (40);

$$\begin{aligned} y^1 &= x \cdot g \\ &= 1 \end{aligned} \tag{40}$$

Because the multiplied signal $S_{M1}$ is input into the succeeding multiplier circuit $M_2$ to be multiplied therein, a multiplied signal $S_{M2}$ having amplitude $y_2$ denoted by the following equation (4) is obtained:

$$\begin{aligned} y^2 &= y_0 \cdot g \\ &= 1 \cdot x^{-1} \\ &= x^{-1} \end{aligned} \tag{41}$$

Thus, in the multiplier circuits $M_1$ though $M_N$, the input signal is sequentially multiplied so that the multiplier processing is carried out "N" times corresponding to the N-series connected multiplier circuits. In the respective multiplier circuits $M_1$ to $M_N$, the amplitudes of the multiplier signals $S_{N1}$, $S_{M2}$, $S_{M3}$, ..., $S_{MN}$ can be obtained which are represented by the following generic equation:

$$Y_n Y_{n-1} \cdot g$$
$$n = 1, 2, 3, ..., N \tag{42}$$

When simplifying this generic equation (42), the multiplied signals can be expressed by the following equation:

$$Y_n = x^{-(n-1)} \tag{43}$$

In addition, the amplitude compressing/expanding circuit 420 includes (N+1) weighting circuits $A_0$, $A_1$, $A_2$, $A_3$, ..., $A_N$ made of amplifier circuits. Weighting circuit $A_0$ receives the input signal $S_I$ while the remaining weighting circuits receive, respectively multiplier signals $S_{M1}$, $S_{M2}$, $S_{M3}$, ..., $S_{MN}$. Moreover, the amplitude compressing/expanding circuit 420 weights both the input signal $S_I$ and the respective multiplied signals $S_{N1}$ to $S_{MN}$ by weighting coefficients determined by the gains of amplifiers forming the respective weighting circuits $A_O$ to $A_N$. The output signal $S_{O1}$ of the amplitude compressing/expanding circuit 420 is the summation of signals $S_{AO}$ to $S_{An}$.

Expressing the weighting coefficients of the respective weighting circuits $A_O$ to $A_N$ by the respective values $C_0$, $C_1$, $C_2$, $C_3$, ..., $C_N$, enables the amplitude of the respective weighting circuit output signals to be expressed in terms of the weighting coefficients. The output signal $S_{AO}$ may be expressed by the following equation:

$$\begin{aligned} Y_{A0} &= C_0 \cdot Y_0 \\ &= C_0 x \end{aligned} \tag{44}$$

In the remaining weighting circuits $A_1$, to $A_n$, the output signals $S_{A1}$, $S_{A2}$, $S_{A3}$, ..., $S_{AN}$ can be represented by the following generic equation:

$$Y_{AN} = C_n Y_n \tag{45}$$
$$= C_n x^{-(n-1)}$$

As a consequence, the output signal $S_{O1}$ can be obtained via the adder circuit 429 from the previous equations (44) and (45), as represented by the following equation:

$$y_{01} = y_{A0} + \sum_{n=1}^{N} y_{An} \tag{46}$$
$$= \sum_{n=0}^{N} C_n x^{1-n}$$
$$= C_0 x + C_1 + C_2 x^{-1} + C_3 x^{-2} + \ldots = C_N x^{1-N}$$

Accordingly since the weighting coefficients $C_O$ to $C_N$ of the weighting circuits $A_O$ to $A_N$ are set to the desired values, the input/output characteristics expressed by the higher order function formula of the equation (46) can be achieved, and an input/output characteristic is obtained in which the amplitude compression ratio is smoothly and complexly varied with a simpler circuit arrangement.

In the practical case, when both the weighting coefficients $C_O$ and $C_1$ of the weighting circuits $A_0$ and $A_1$ are set to a value of 1, and the weighting coefficients $C_2$ and $C_N$ of the weighting circuits $A_2$ to $A_N$ are set to a value of 0, the output signal $S_{O1}$ can be represented by the following relation equation (47) as derived from the previous equation (46):

$$y_{O1} = x + 1 \tag{47}$$

Figure 34:
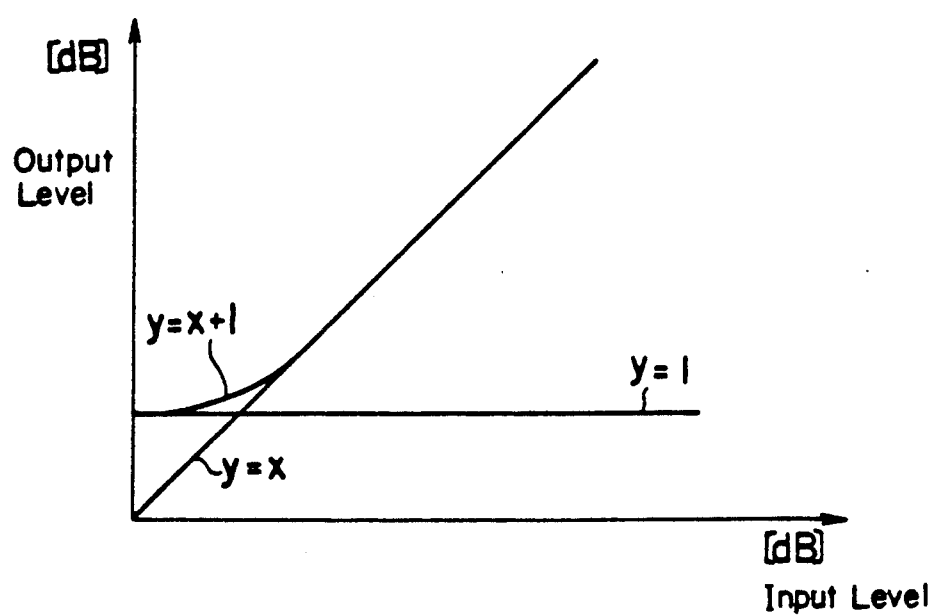

In such case, as illustrated in FIG. 34, where the amplitude compression ratio CR is equal to both x and the value of 1, as represented by the following relationships:

$$y = 1 \tag{48}$$

$$y = x \tag{49}$$

the amplitude compressing/expanding circuit can be obtained where the amplitude compression ratio is smoothly changed from x to the value of 1 at the threshold point corresponding to the input level at which the first mentioned input/output characteristic is intercepted. The input/output characteristic of the amplitude compressing/expanding circuit then is expressed by the following equations:

$$y = 1 \tag{48}$$

$$y = x \tag{49}$$

With the above-described circuit arrangement, the control signal $S_{G1}$ is obtained from the control signal generator circuit 421 based upon the input signal level of the input signal $S_I$. The series-connected multiplier circuits $M_1$ to $M_N$ perform the multiplying process on the input signal $S_I$ with the coefficient $x^{-1}$, based upon this control signal.

As a result, the multiplied signals $S_{N1}$ o $S_{MN}$ are obtained from the multiplier circuits $M_1$ to $M_N$ representing the respective terms of the (N−1) order function formula with respect to the amplitude "X" of the input signal $S_I$. These multiplied signals are summed with the input signal $S_I$ via the predetermined weighting coefficients $C_O$ to $C_N$ of the weighting circuits $A_O$ to $A_N$ and then output, so that the input/output characteristic represented by the (N−1) higher order function formula can be obtained.

With the above-described circuit arrangement, the multiplier circuits are series-connected and the multiplied outputs are added to the predetermined coefficients so as an input/output characteristic represented by the higher order function formula with respect to the amplitude of the input signal can be obtained. As a consequence, an amplitude compressing/expanding circuit can be obtained with simpler circuit arrangement, in which the amplitude compression ratio is smoothly and complexly changed.

What is claimed is:

1. A digital processing circuit for sequentially receiving a plurality of input digital signals and for normalizing said input digital signals for a floating point arithmetic processing circuit, comprising:

pre-bit-shifting means for sequentially bit-shifting each of said input digital signals by an amount determined by a control signal and providing respective pre-bit-shifted input signals;

normalizing means supplied with said pre-bit-shifted input signals for sequentially bit-shifting said pre-bit-shifted input signals such that respective normalized output signals are generated, said normalizing means further sequentially generating respective bit shift signals, each of said bit-shift signals representing a bit shift amount required for normalizing a pre-bit-shifted input signal corresponding to the input digital signal occurring just prior to the current input digital signal applied to said pre-bit-shifting means; and control means sequentially supplied with said respective bit shift signals for generating said control signal supplied to said pre-bit-shifting means.

2. A digital processing circuit according to claim 1, wherein said pre-bit-shifting means includes multiplier means for multiplying said control signal by said input digital signal, and said control means includes shift register means.

3. A digital processing circuit according to claim 1, wherein said normalizing means generates a mantissa portion of said normalized output signal and includes counter means supplied with said bit shift signal for generating an index portion of said normalized output signal.

4. An amplitude expanding and/or compressing circuit, for expanding, compressing or expanding and compressing an amplitude of an input signal, comprising;

control signal generating means for generating a control signal in response to the input signal, said control signal generating means including absolute value generating means for providing an absolute value output signal, envelope detector means for detecting an envelope of said absolute value output signal and providing a respective detected envelope output signal, inverse value generating means for generating an inverse value of said detected envelope output signal, pre-bit-shifting means for bit-shifting said detected envelope output signal by an amount determined by said control signal and providing a respective pre-bit-shifted signal, normalizing means receiving said pre-bit-shifted signal for bit-shifting said pre-bit-shifted signal such that a normalized output signal is generated, said normalizing means further generating a bit shift signal representing a bit shift amount required for normalizing a pre-bit-shifted signal corresponding to the detected envelope output signal occurring just prior to the current detected envelope output signal applied to said pre-bit-shifting means, and control means supplied with said bit shift signal for generating said control signal supplied to said pre-bit-shifting means;

signal multiplier means receiving said control signal from said control signal generating means and said input signal for multiplying said control signal and said input signal to generate a multiplied output signal;

first subtractor means receiving an output of said signal multiplier means for subtracting said input signal from said multiplied output signal to generate a first subtractor output signal;

signal processing means receiving an output of said first subtractor means for generating a processed output signal from said first subtractor output signal; and second subtractor means receiving an output of said signal processing means for subtracting said processed output signal from said multiplied output signal to generate an amplitude expanded, compressed, or expanded and compressed output signal.

5. The circuit according to claim 4, wherein said detecting portion of said envelope detector means includes a subtractor supplied with the output of said absolute value generating means, a mode detector for detecting the polarity of an output signal of said subtractor, a first multiplier for multiplying an output signal of said mode detector by said output signal of said subtractor, an adder for generating the envelope detected output signal, a sample delay circuit supplied with said envelope detected output signal for delaying the same for one sample duration, an output signal of said sample delay circuit being supplied to said subtractor, and a second multiplier for multiplying a predetermined coefficient with said output signal of said sample delay circuit to generate an output signal to be supplied to said adder.

* * * * *